United States Patent
Lu et al.

(10) Patent No.: US 10,706,941 B1
(45) Date of Patent: Jul. 7, 2020

(54) MULTI-STATE PROGRAMMING IN MEMORY DEVICE WITH LOOP-DEPENDENT BIT LINE VOLTAGE DURING VERIFY

(71) Applicant: SanDisk Technologies LLC, Addison, TX (US)

(72) Inventors: Ching-Huang Lu, Fremont, CA (US); Vinh Diep, San Jose, CA (US); Zhengyi Zhang, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/371,289

(22) Filed: Apr. 1, 2019

(51) Int. Cl.
| | |
|---|---|
| *G11C 16/26* | (2006.01) |
| *G11C 16/34* | (2006.01) |
| *G11C 16/10* | (2006.01) |
| *G11C 16/04* | (2006.01) |
| *G11C 16/24* | (2006.01) |

(52) U.S. Cl.
CPC .......... *G11C 16/26* (2013.01); *G11C 16/0408* (2013.01); *G11C 16/0466* (2013.01); *G11C 16/10* (2013.01); *G11C 16/24* (2013.01); *G11C 16/34* (2013.01)

(58) Field of Classification Search
CPC ..... G11C 16/26; G11C 16/34; G11C 16/0408; G11C 16/24; G11C 16/0466; G11C 16/10
See application file for complete search history.

(56) References Cited

U.S. PATENT DOCUMENTS

| | | | |
|---|---|---|---|
| 6,396,310 | B2 | 5/2002 | Shin |
| 7,330,375 | B2 | 2/2008 | Daga et al. |
| 7,692,970 | B2 | 4/2010 | Park et al. |
| 8,223,555 | B2 | 7/2012 | Kim et al. |
| 8,274,838 | B2 | 9/2012 | Dutta et al. |
| 8,743,618 | B1 | 6/2014 | Kamei et al. |
| 8,913,432 | B2 | 12/2014 | Dong et al. |
| 9,530,512 | B2 | 12/2016 | Ray et al. |

(Continued)

FOREIGN PATENT DOCUMENTS

EP  1831894 A1  9/2007

OTHER PUBLICATIONS

International Search Report & The Written Opinion of the International Searching Authority dated Apr. 1, 2020, International Application No. PCT/US2019/067005.

*Primary Examiner* — Mohammed A Bashar
(74) *Attorney, Agent, or Firm* — Vierra Magen Marcus LLP

(57) ABSTRACT

Techniques are described for programming memory cells with reduced widening of the threshold voltage distributions. Bit line voltages are adjusted during verify tests for memory cells assigned to the upper data state in a pair of adjacent data states which are concurrently verified. An elevated bit line voltage is applied and then stepped up in successive program loops. A lower, fixed bit line voltage is used for verifying the lower data state in the pair of adjacent data states. In one option, the step size increases progressively over the program loops. In another option, the minimum level of the elevated bit line voltage is lower for higher data states. In another option, the minimum level of the elevated bit line voltage is set as a function of data states, program-erase cycles and/or temperature.

20 Claims, 21 Drawing Sheets

(56) References Cited

U.S. PATENT DOCUMENTS

| | | |
|---|---|---|
| 9,922,719 B2 | 3/2018 | Li et al. |
| 10,157,681 B2 | 12/2018 | Mokhlesi |
| 2011/0007571 A1 | 1/2011 | Park et al. |
| 2011/0013457 A1* | 1/2011 | Han .................... G11C 11/5628 365/185.18 |
| 2012/0069674 A1 | 3/2012 | Lee |
| 2014/0126291 A1* | 5/2014 | Mihnea ................. G11C 16/10 365/185.17 |

* cited by examiner

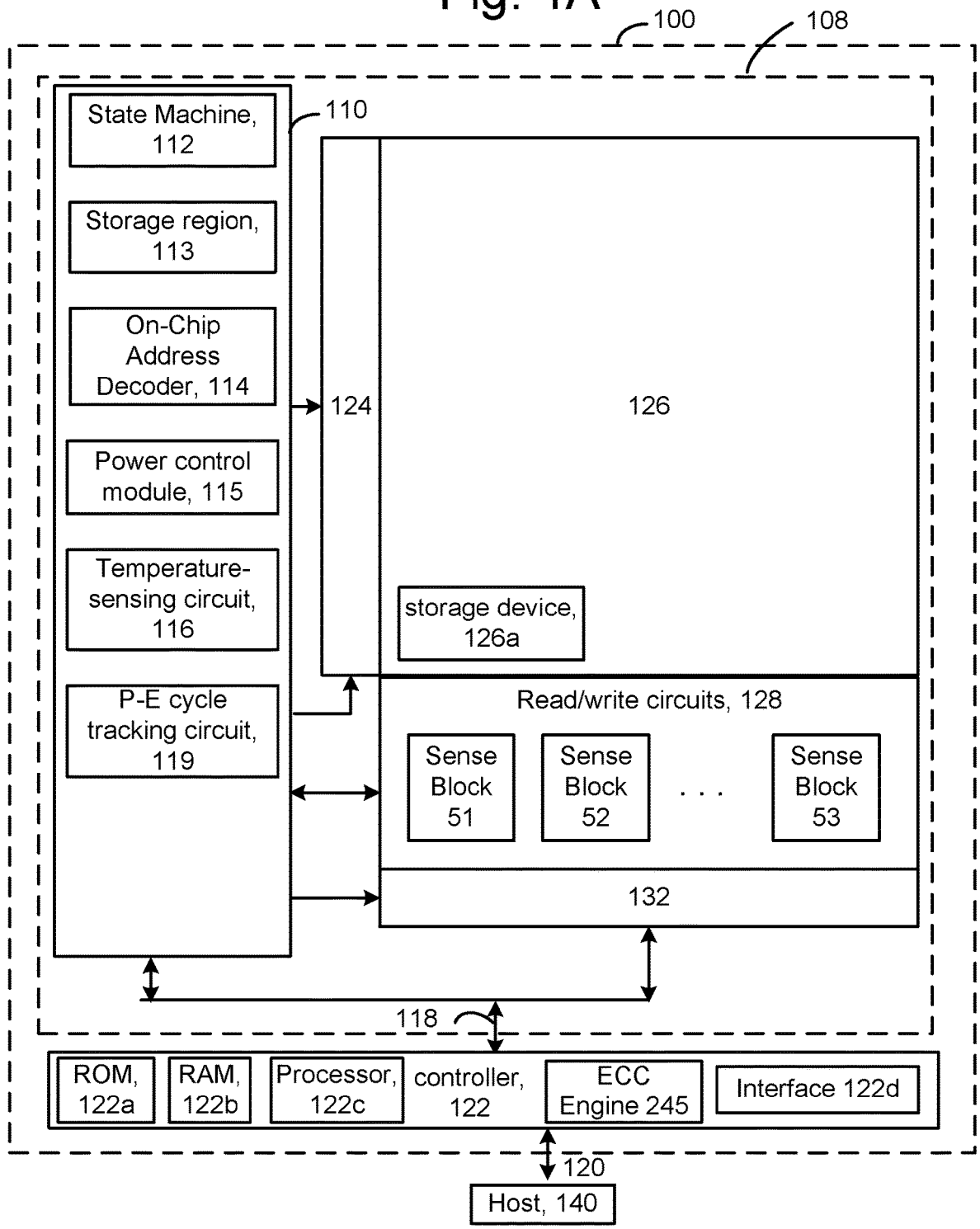

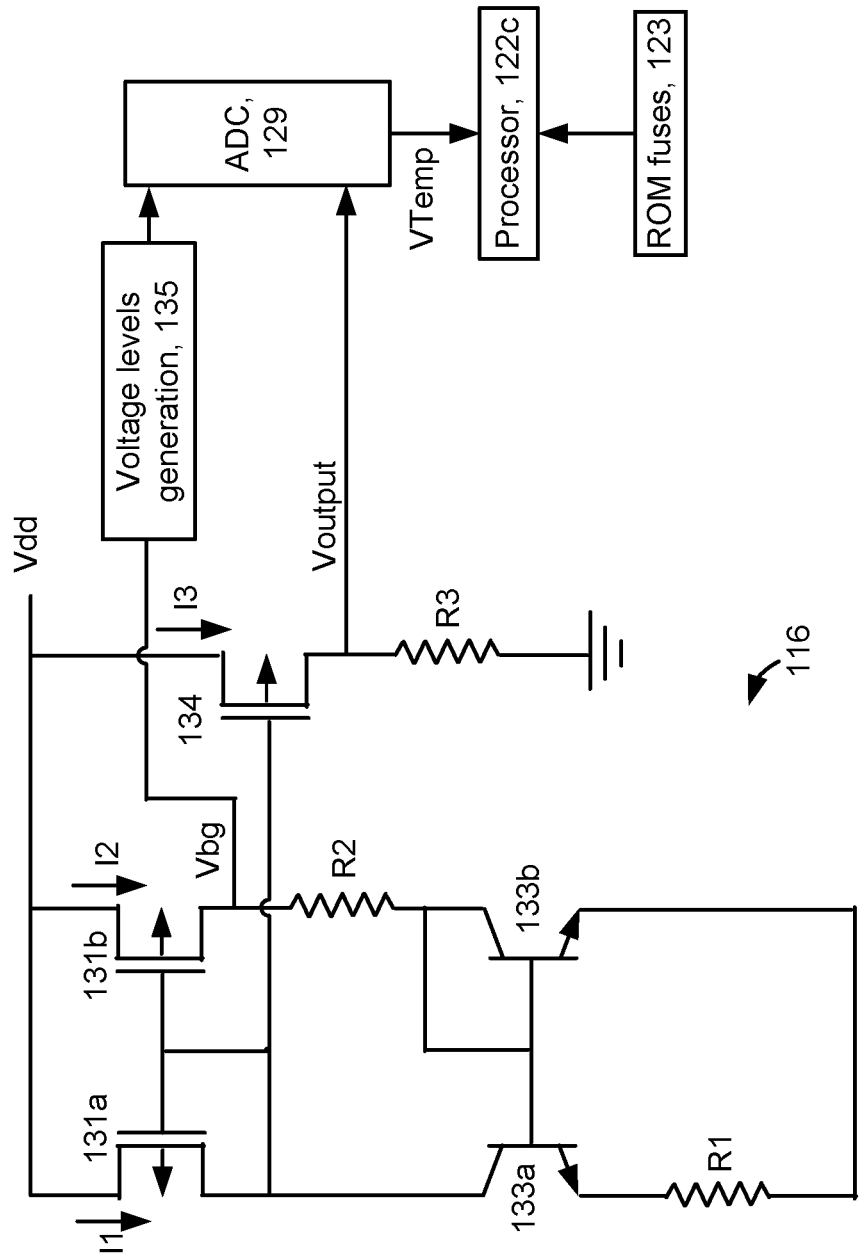

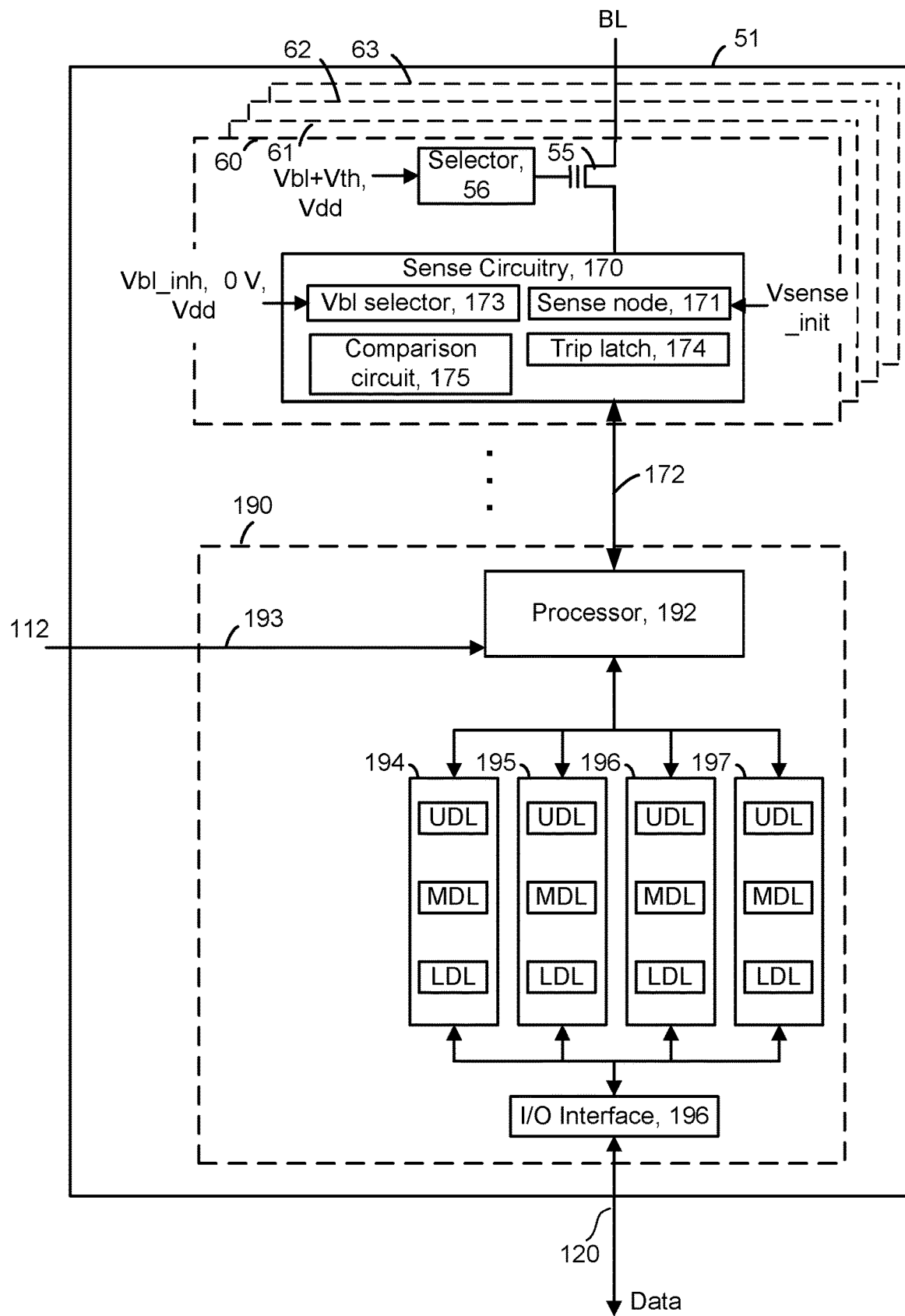

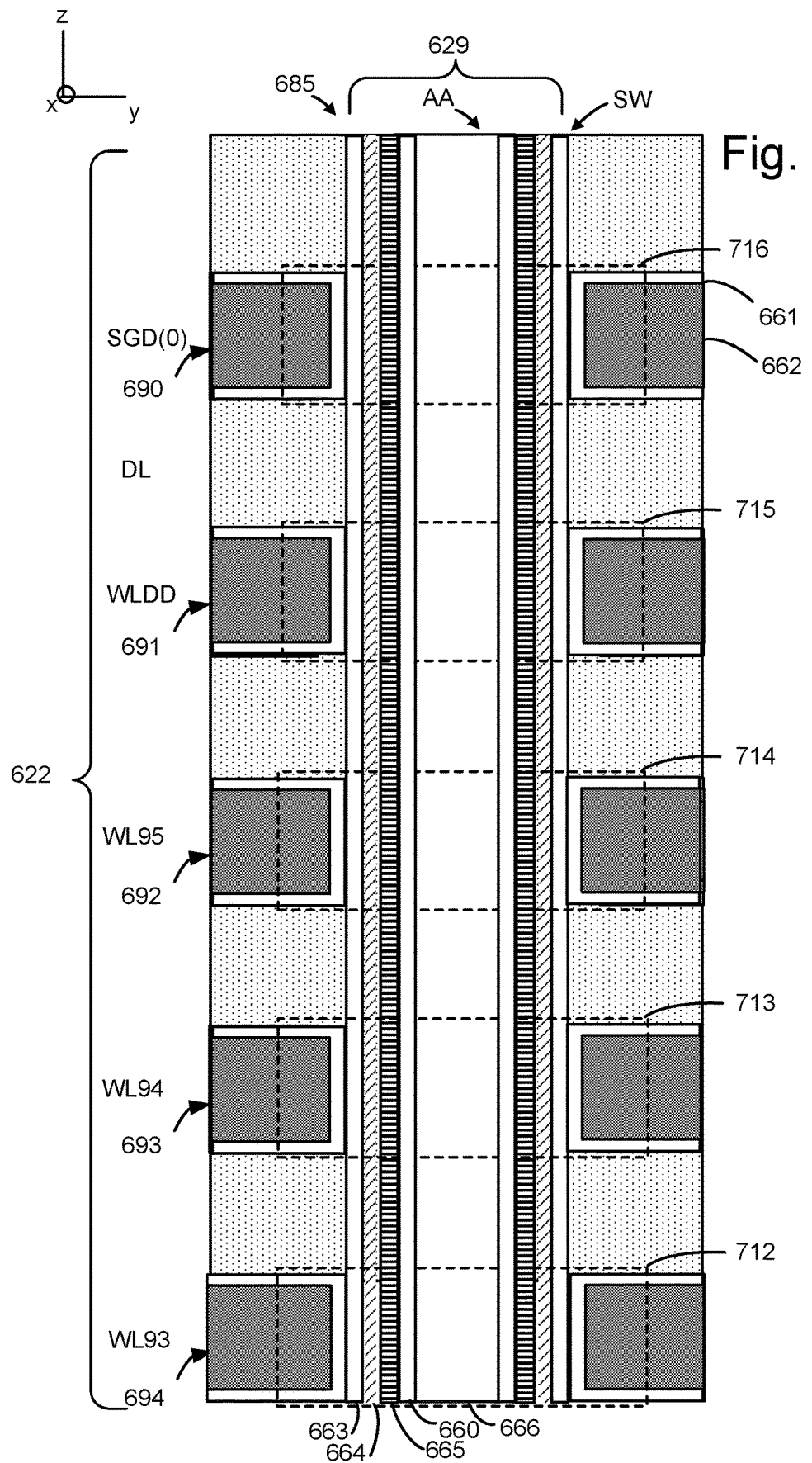

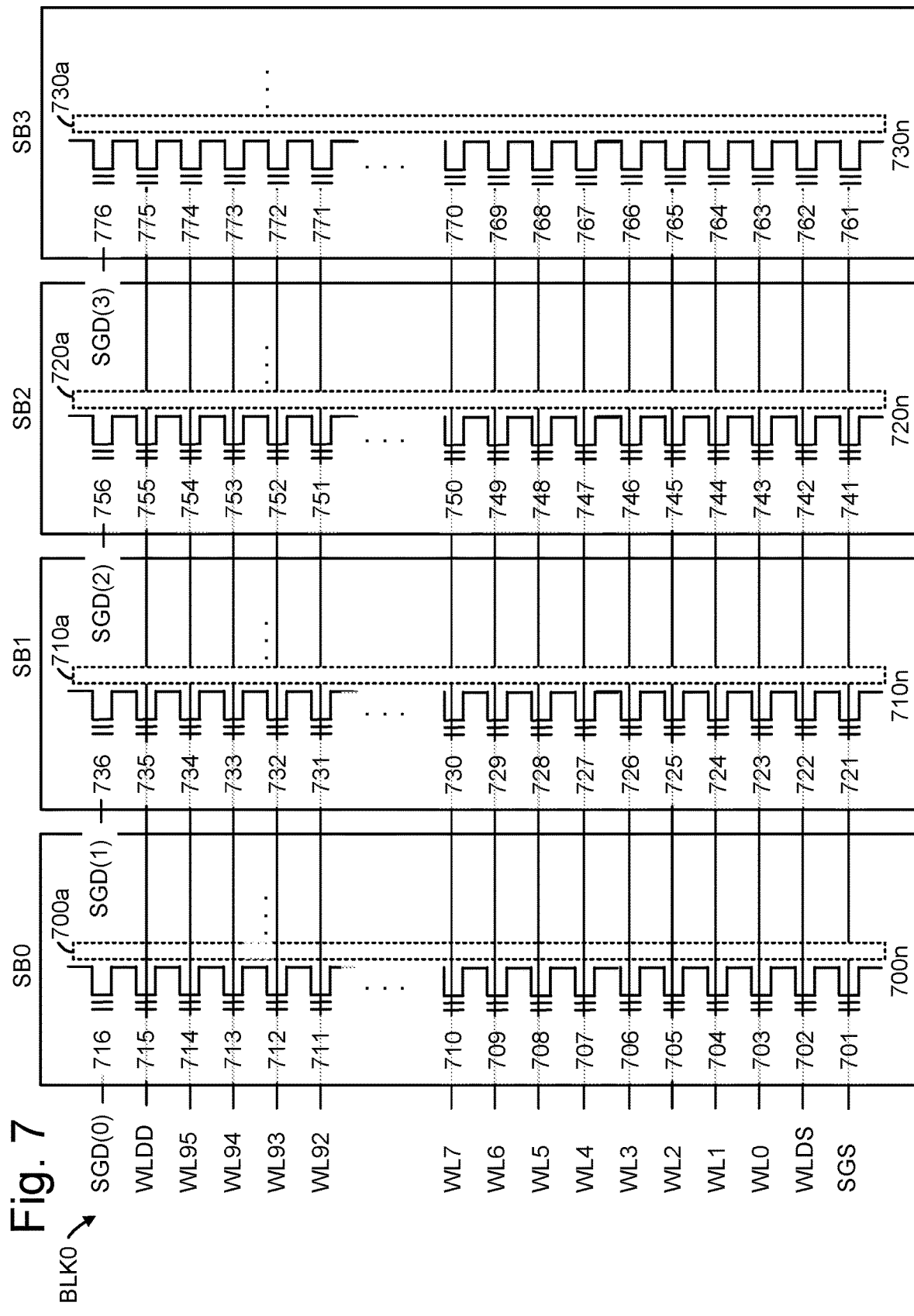

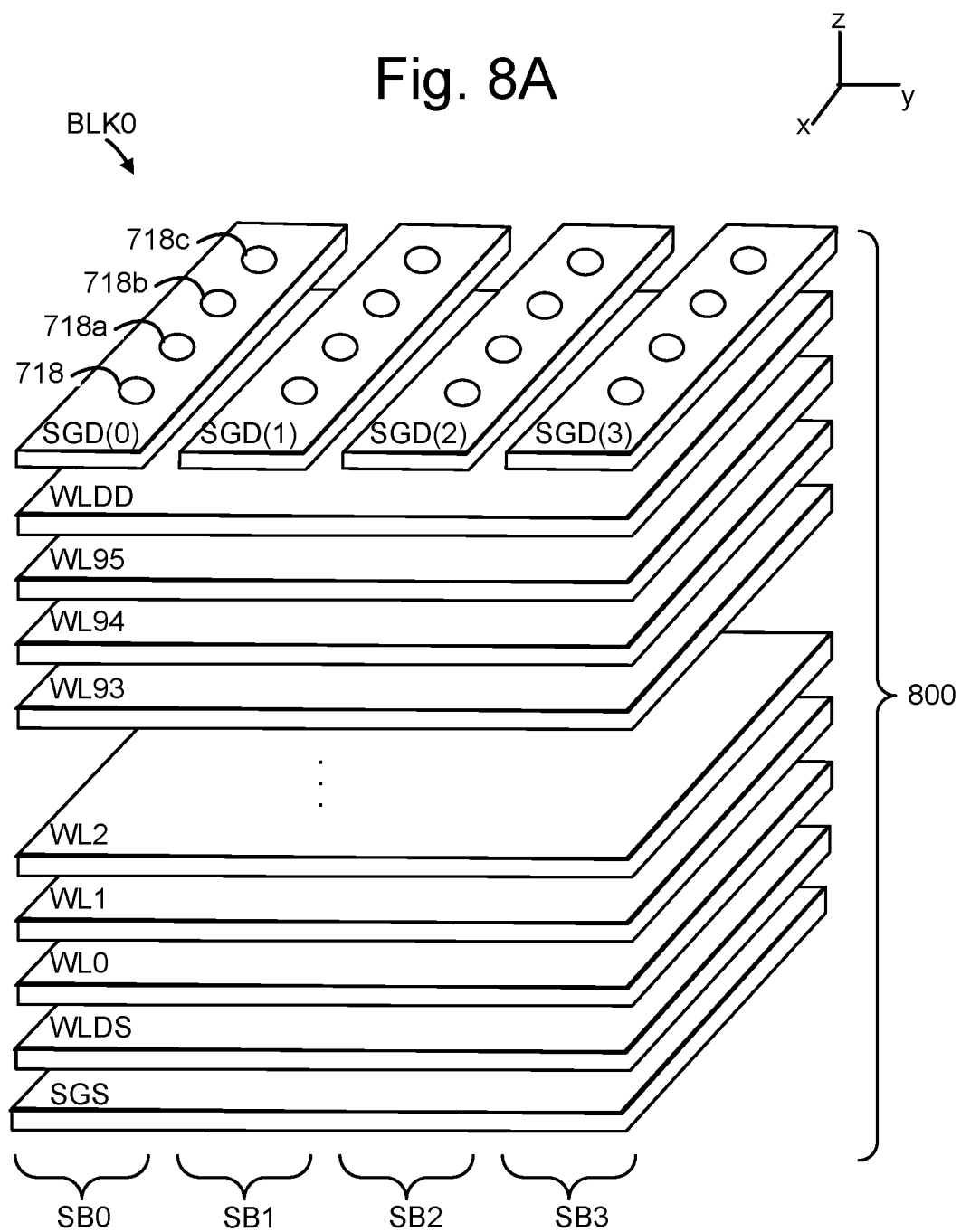

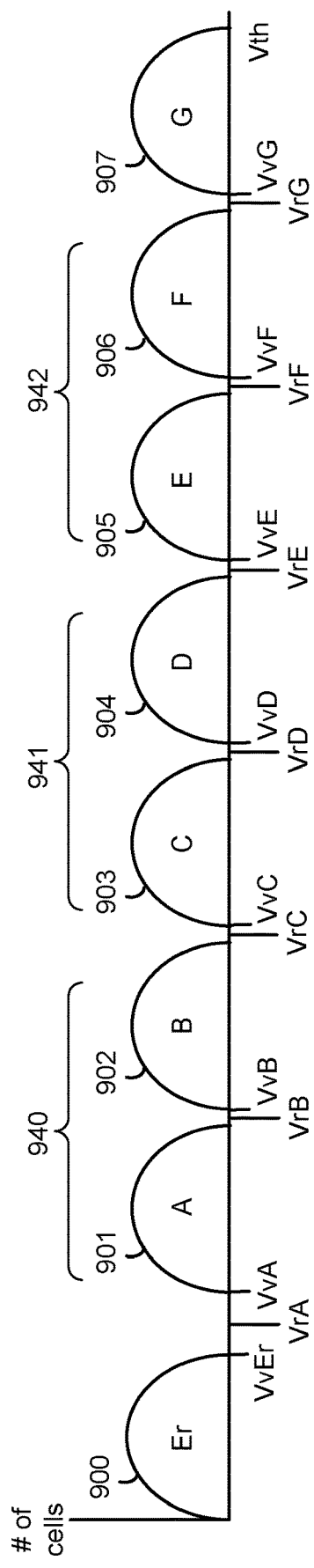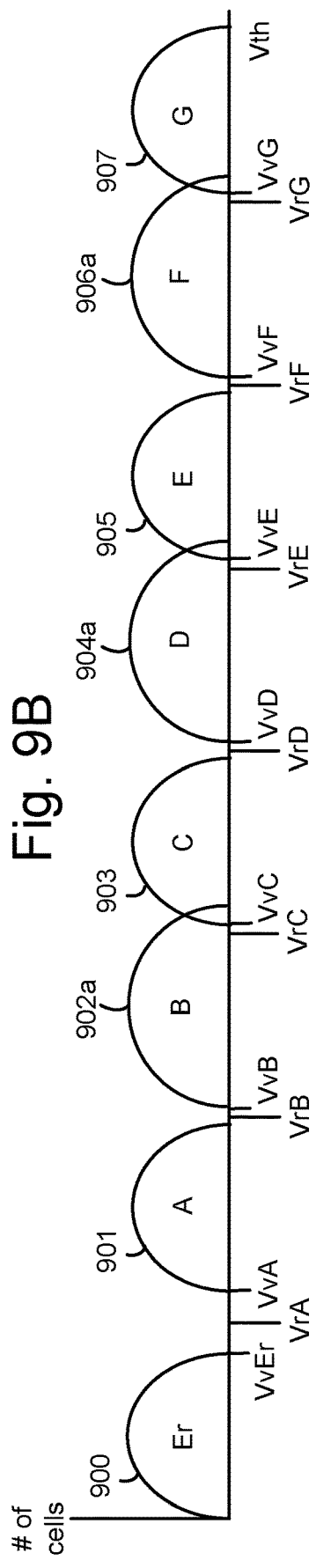

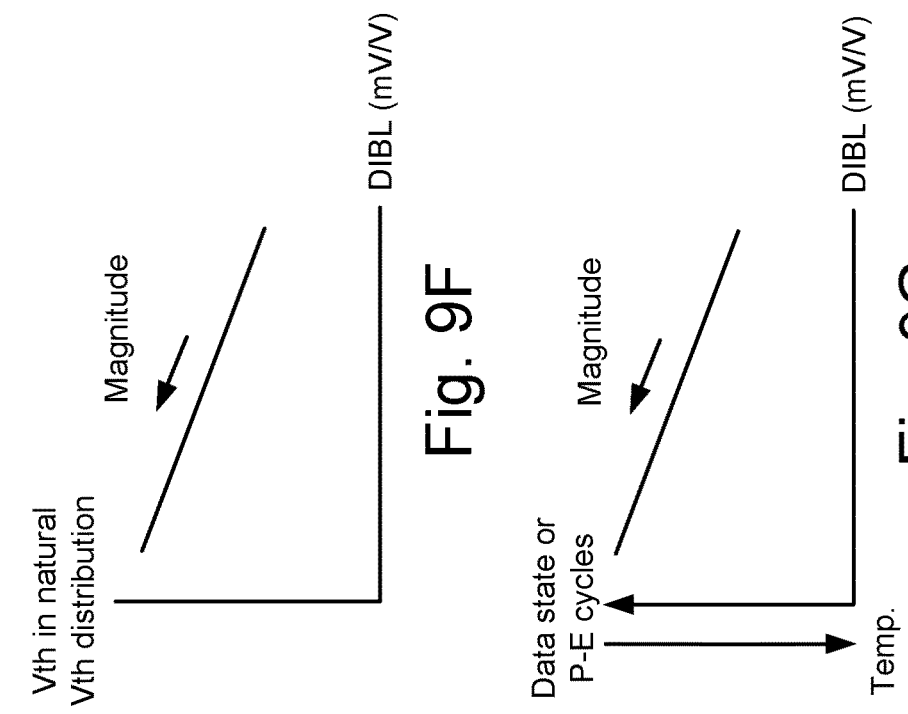
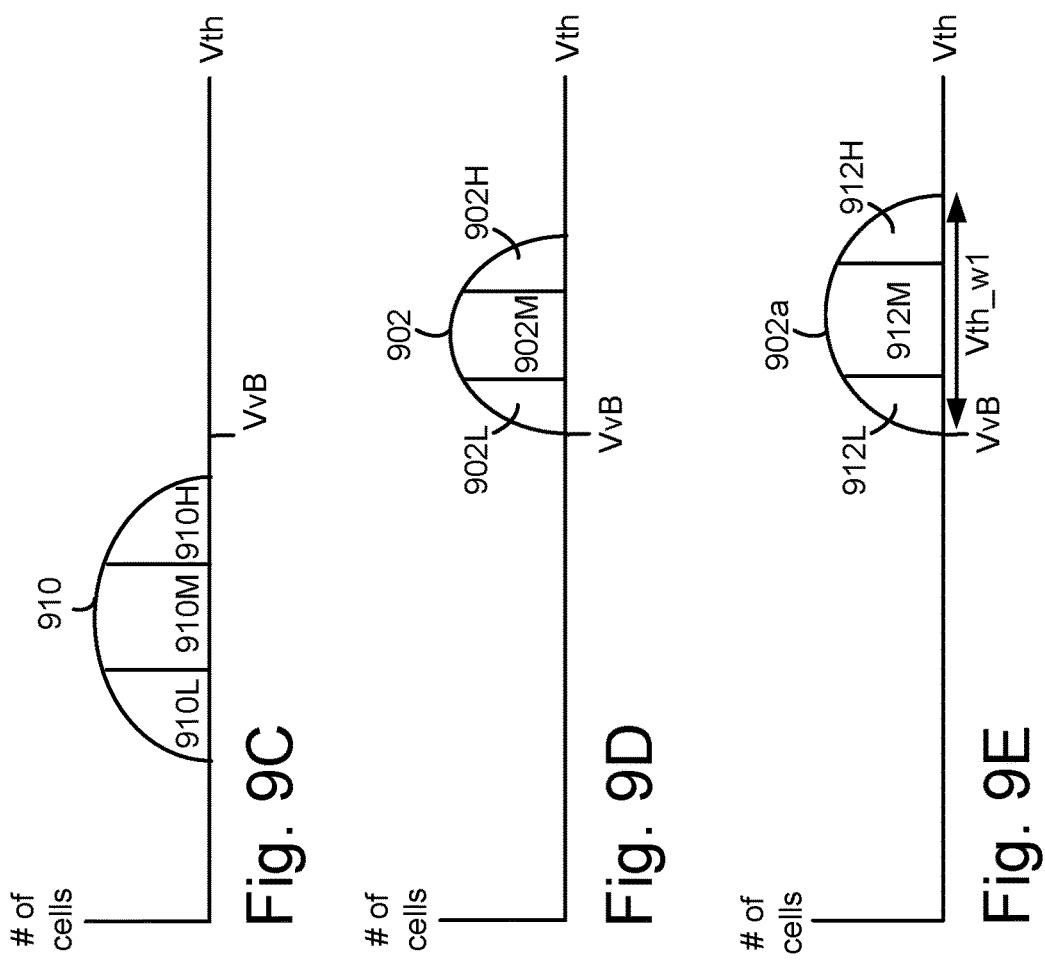

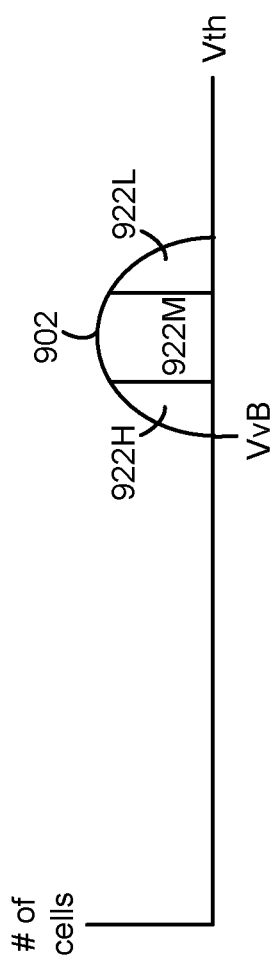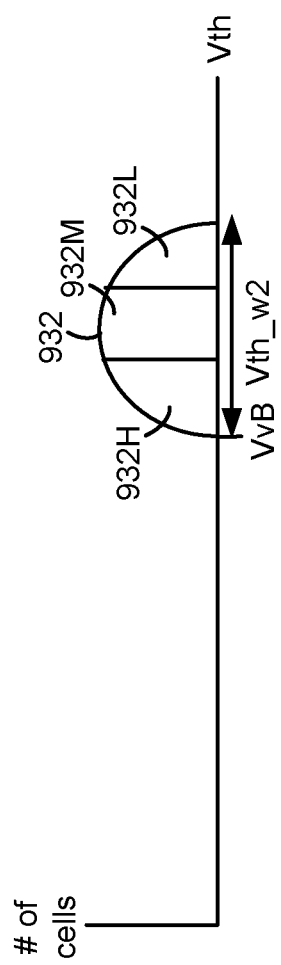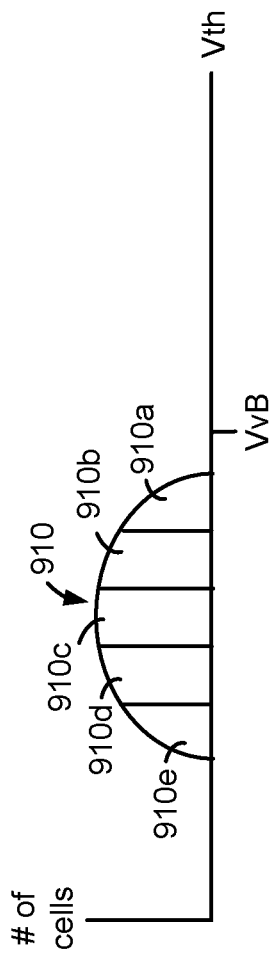

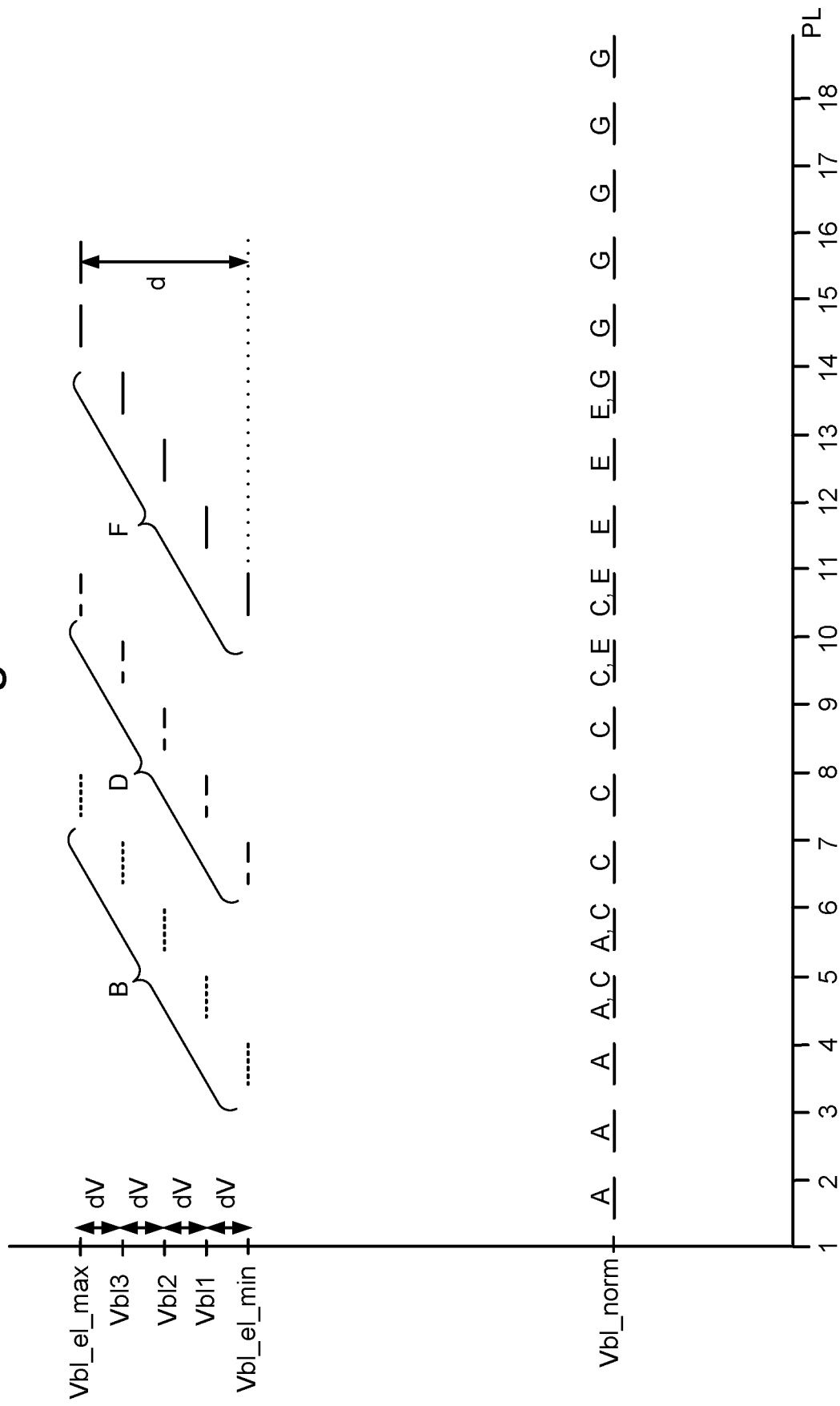

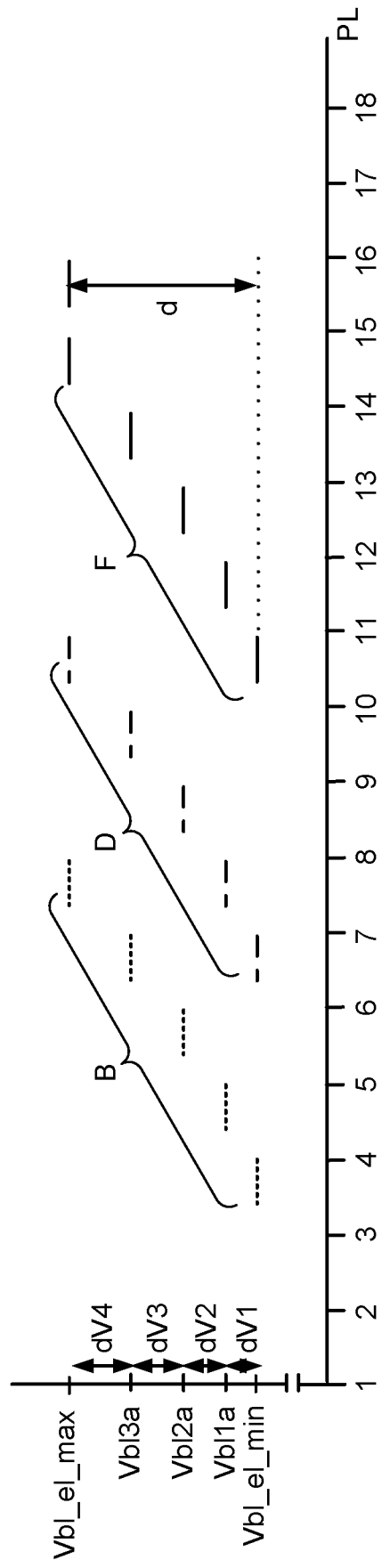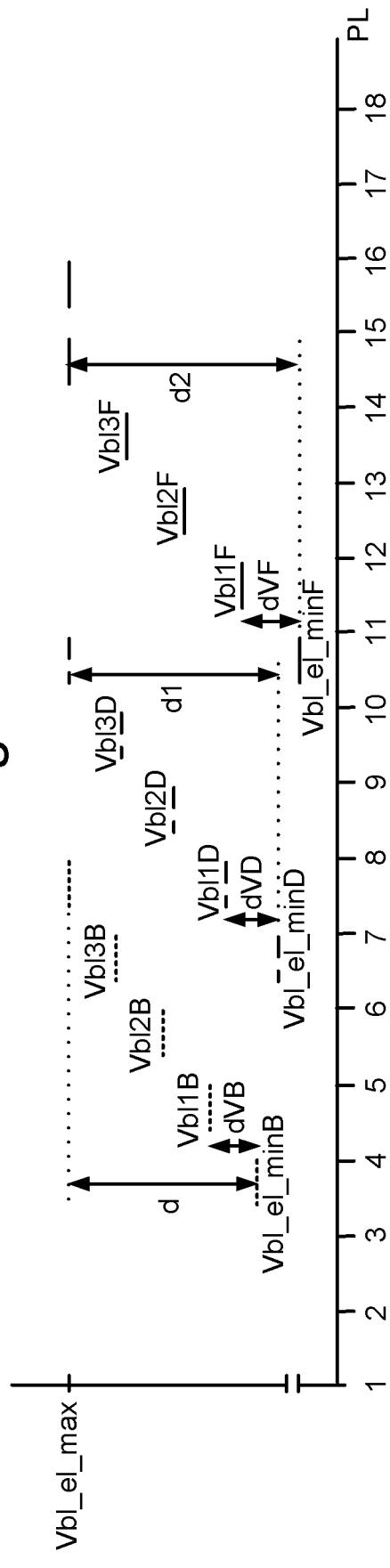

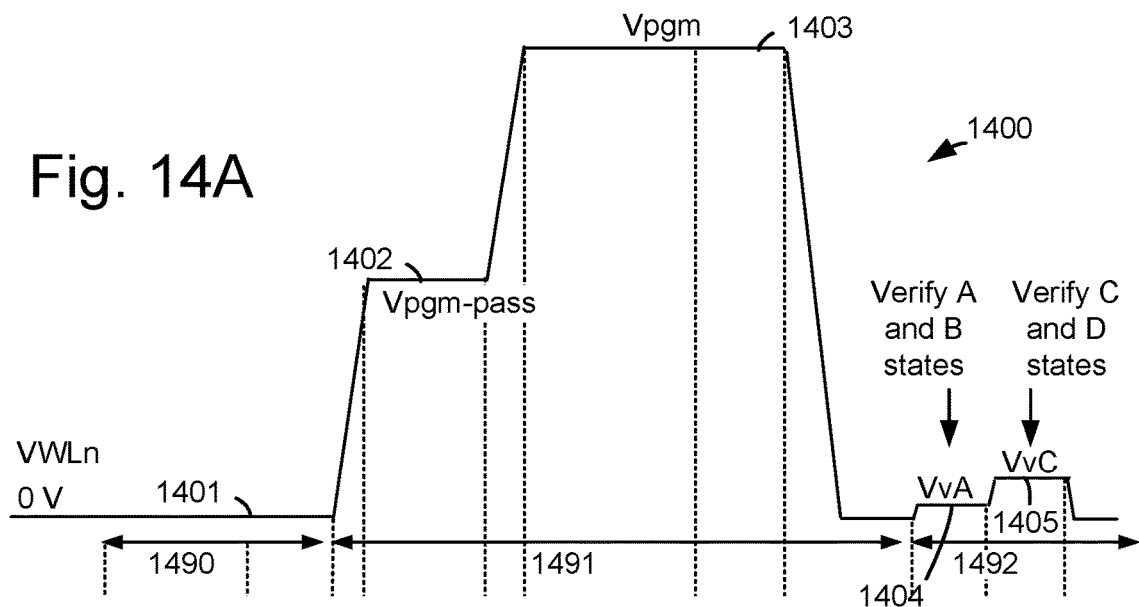
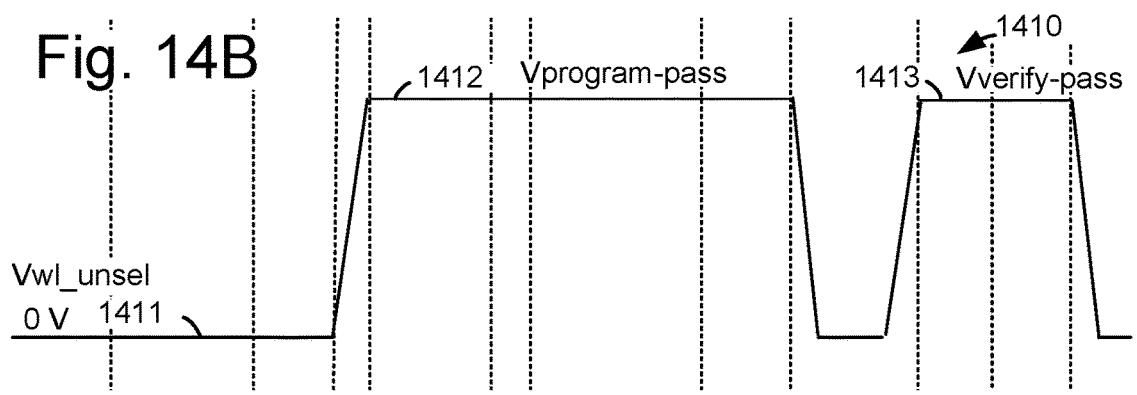
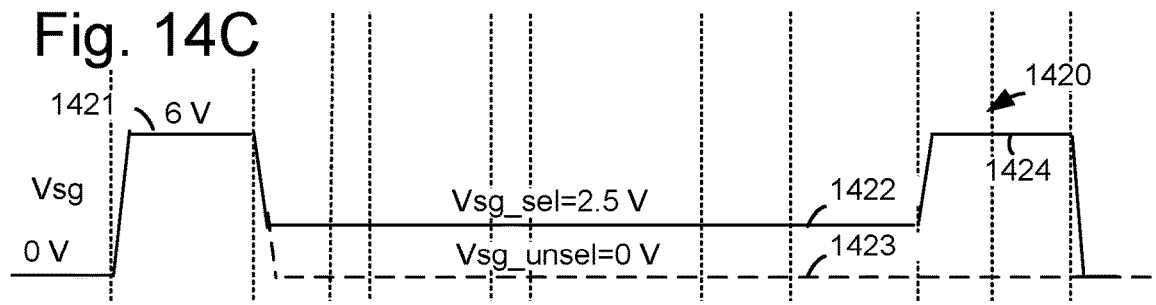
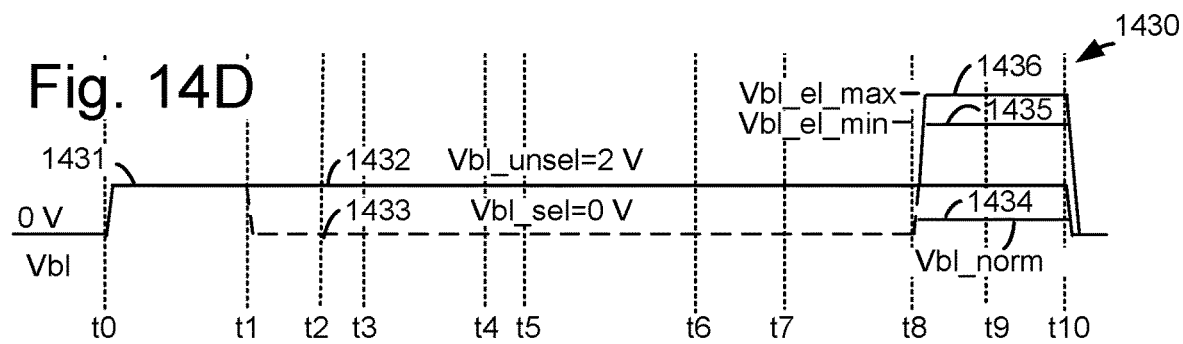

MULTI-STATE PROGRAMMING IN MEMORY DEVICE WITH LOOP-DEPENDENT BIT LINE VOLTAGE DURING VERIFY

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1A is a block diagram of an example memory device.

FIG. 1B depicts an example of the temperature-sensing circuit 116 of FIG. 1A.

FIG. 2 is a block diagram depicting one embodiment of the sense block 51 of FIG. 1.

FIG. 6B depicts a close-up view of the region 622 of the stack of FIG. 6A.

FIG. 7 depicts an example view of NAND strings in a block BLK0 which is consistent with FIGS. 4 and 6A.

FIG. 8A depicts control gate layers in the block BLK0, consistent with FIG. 7.

FIG. 9A depicts an example of an ideal set of Vth distributions of a set of memory cells having eight data states.

FIG. 9B depicts an example of a set of Vth distributions of a set of memory cells having eight data states, where the Vth distribution is wider for some data states when a bit line voltage used in a read operation is lower than the bit line voltage used in the verify test.

FIG. 9C depicts a natural Vth distribution 910 for memory cells assigned to the B state, showing low-, medium- and high-DIBL memory cells in regions 910L, 910M and 910H, respectively.

FIG. 9D depicts the Vth distribution 902 of FIG. 9A, showing low-, medium- and high-DIBL memory cells in regions 902L, 910M and 910H, respectively, where the high-DIBL memory cells are in the upper tail of the Vth distribution.

FIG. 9E depicts the Vth distribution 902a of FIG. 9B for memory cells assigned to the B state, showing low-, medium- and high-DIBL memory cells in regions 912L, 912M and 912H, respectively, where the Vth distribution width is increased compared to the Vth distribution width FIG. 9D.

FIG. 9F depicts a plot of Vth in the natural Vth distribution of FIG. 9C versus DIBL.

FIG. 9G depicts a plot of data state, program-erase (P-E) cycles and temperature versus DIBL.

FIG. 9H depicts the Vth distribution 902 of FIG. 9A, showing high, medium and low-DIBL memory cells in regions 922H, 922M and 922L, respectively, where the high-DIBL memory cells are in the lower tail of the Vth distribution.

FIG. 9I depicts a Vth distribution 932 for memory cells in the Vth distribution 902 of FIG. 9H, showing high, medium and low-DIBL memory cells in regions 932H, 932M and 932L, respectively, where the Vth distribution width is increased compared to the Vth distribution width FIG. 9H, but the Vth distribution width Vth_w2 is less than the Vth distribution width Vth_w1 in FIG. 9E.

FIG. 9J depicts the natural Vth distribution 910 of FIG. 9C, showing five regions 910a-910e, where the memory cells of each region are verified using a different bit line voltage such as by using the increasing bit line voltage of FIG. 11A-11C.

FIG. 11A depicts a plot of bit line voltages used during verify tests consistent with FIGS. 10A and 10B, where Vbl_norm is used for the A, C, E and G states and a common set of increasing bit line voltages with a common fixed step size is used for the B, D and F states.

FIG. 11B depicts a plot of bit line voltages used during verify tests consistent with FIGS. 10A and 10B, where Vbl_norm (not shown) is used for the A, C, E and G states and a common set of increasing bit line voltages with a common progressively increasing step size is used for the B, D and F states.

FIG. 11C depicts a plot of bit line voltages used during verify tests consistent with FIGS. 10A and 10B, where Vbl_norm (not shown) is used for the A, C, E and G states and a different set of increasing bit line voltages with different minimum voltages and different step sizes is used for the B, D and F states, where the minimum voltage is lower and the step size is higher for higher data states.

FIG. 14A-14D depicts examples of voltage signals which can be used in a program operation, consistent with FIGS. 12A and 12B.

FIG. 14A depicts voltages applied to a selected word line.

FIG. 14B depicts voltages applied to unselected word lines.

FIG. 14C depicts voltages applied to select gate transistors.

FIG. 14D depicts voltages applied to bit lines.

FIG. 15A depicts voltages applied to a selected word line.

FIG. 15B depicts voltages applied to unselected word lines.

FIG. 15C depicts voltages applied to select gate transistors.

FIG. 15D depicts voltages applied to bit lines.

DETAILED DESCRIPTION

Apparatuses and techniques are described for programming memory cells in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells.

The memory cells can include data memory cells, which are eligible to store user data, and dummy or non-data memory cells which are ineligible to store user data. A dummy memory cell may have the same construction as a data memory cell but is considered by the controller to be ineligible to store any type of data including user data. A dummy word line is connected to a dummy memory cell. One or more dummy memory cells may be provided at the drain and/or source ends of a string of memory cells to provide a gradual transition in the channel voltage gradient.

Figure 10A:
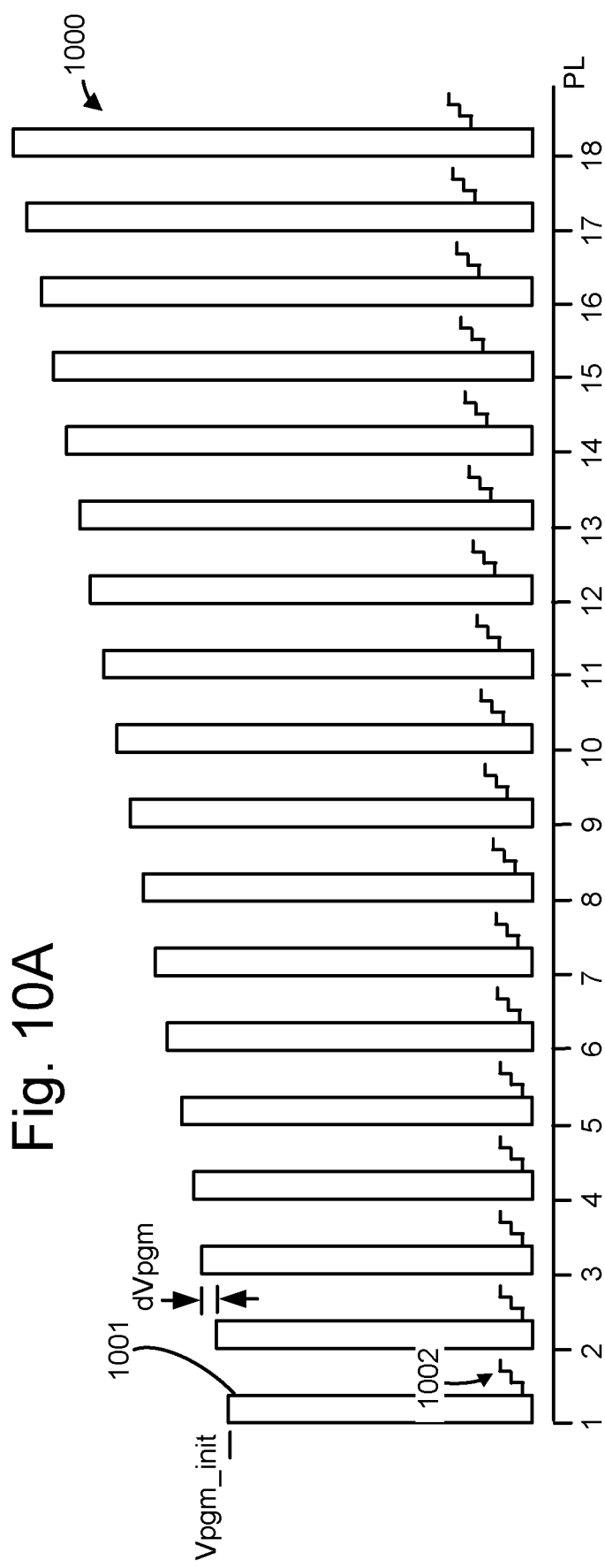
FIG. 10A depicts an example voltage signal in a program operation.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages or pulses which are applied to the word line in respective program loops or program-verify iterations, such as depicted in FIG. 10A. Verify tests may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three higher data states referred to as the A, B and C data states. In a three-bit per cell memory device, there are eight data states including the erased state and seven higher data states referred to as the A, B, C, D, E, F and G data states (see FIG. 9A). In a four-bit per cell memory device, there are sixteen data states including the erased state and fifteen higher data states. The data states may be referred to as the S0-S15 data states where S0 is the erased state. Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

However, the verify tests which occur during a verify operation consume time when a separate verify voltage is applied to the selected word line for each programmed data state. One approach is to perform a verify test for two adjacent data states concurrently by using different bit line voltages and one control gate or word line voltage. The memory cells assigned to the lower data state in the pair can received a normal, relatively low bit line voltage, Vbl_norm, such as 0.5 V while the memory cells assigned to the upper data state in the pair can received an elevated bit line voltage, Vbl_el such as 5-6 V. When an elevated bit line voltage is applied to a NAND string, a relatively high level of current flows in the NAND string and the Vth is detected as being relatively low. Accordingly, it is harder for the memory cell to pass the verify test and it is programmed to a higher Vth than if a lower bit line voltage was used.

When the memory cells of the two adjacent data states are subsequently read in a read operation, the bit line is set to Vbl_norm. For the memory cells assigned to the upper data state, the bit line voltage is therefore lower during the read operation than during the verify test. This results in a change in the Vth due to factors such as drain-induced barrier lowering (DIBL). DIBL is a short-channel effect of transistors, and can be measured by a decrease in the Vth of a memory cell as a function of an increase in the drain voltage of the memory cell. See FIGS. 9F and 9G, for example. In particular, the Vth distribution width will appear to be wider for the memory cells assigned to the upper data state of each pair, potentially resulting in read errors. For example, see the Vth distributions for the B, D and F states in FIG. 9B.

Figure 11D:
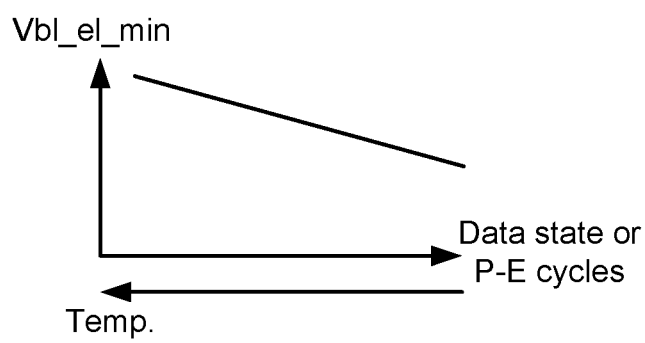
FIG. 11D depicts a plot of Vbl_el_min versus data state, P-E cycles and temperature, consistent with FIG. 9G.
Figure 11E:
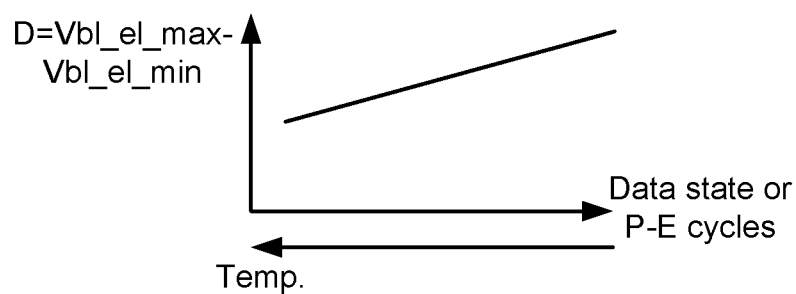
FIG. 11E depicts a plot of D=Vbl_el_max−Vbl_el_min versus data state, P-E cycles and temperature, consistent with FIG. 9G.

Techniques provided herein address the above and other issues by adjusting the bit line voltages used during verify tests for memory cells assigned to the upper data state in a pair of adjacent data states which are concurrently verified. In one approach, an elevated bit line voltage is applied at a minimum level and then stepped up in successive program loops until a maximum level is reached. See FIG. 11A-11C. The minimum and maximum levels and the step size can be the same for different pairs of adjacent data states such as A and B, C and D and E and F, as depicted in FIG. 11A. The step size is fixed in this example. In another option, the step size increases progressively, so that it begins at a relatively small level and increases to a higher level, such as depicted in FIG. 11B. In another option, the minimum level of the elevated bit line voltage is lower for higher data states, such as depicted in FIG. 11C. In another option, the minimum level of the elevated bit line voltage, Vbl_el_min can be set as a function of data states, P-E cycles and/or temperature, as depicted in FIG. 11D. In another option, the difference between the minimum and maximum level of the elevated bit line voltage, Vbl_el_min can be set as a function of data states, P-E cycles and/or temperature, as depicted in FIG. 11E.

The techniques reduce widening of the Vth distributions and therefore reduce read errors. These and other features are discussed further below.

FIG. 1A is a block diagram of an example memory device. The memory device 100, such as a non-volatile storage system, may include one or more memory die 108. The memory die 108 includes a memory structure 126, of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, a power control module 115 (power control circuit), a temperature-sensing circuit 116, and a P-E cycle tracking circuit 119. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program or read operation, for use in connection with FIGS. 11D and 11E. The P-E cycle tracking circuit 119 can track a number of P-E cycles which are accumulated over time by a block or other set of memory cells for use, e.g., in connection with FIGS. 11D and 11E.

See FIG. 1B for an example implementation of the temperature-sensing circuit. The temperature-sensing circuit, program loop tracking circuit, P-E cycle tracking circuit, and transition parameter circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, P-E cycle tracking circuit 119, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122c. This is data indicating a temperature of the memory device. ROM fuses 123 store data which correlates the matching voltage level to a temperature, in one approach. The processor then uses the temperature to set temperature-based parameters in the memory device such as by using the transition parameter circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_inh (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. In various examples herein, the desired Vbl is Vbl_norm or Vbl_el. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal.

The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of data latches, e.g., comprising individual latches LDL, MDL and UDL, can be provided for each sense circuit. In some cases, additional data latches may be used. LDL stores a bit for a lower page of data, MDL stores a bit for a lower page of data, and UDL stores a bit for an upper page of data. This is in an eight-level or three-bits per memory cell memory device.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120, in the LDL, MDL and UDL latches, in a three-bit per memory cells implementation.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. An MDL or UDL latch is flipped when a middle or upper page bit, respectively, is stored in an associated memory cell. This occurs when an associated memory cell completes programming.

Figure 3:
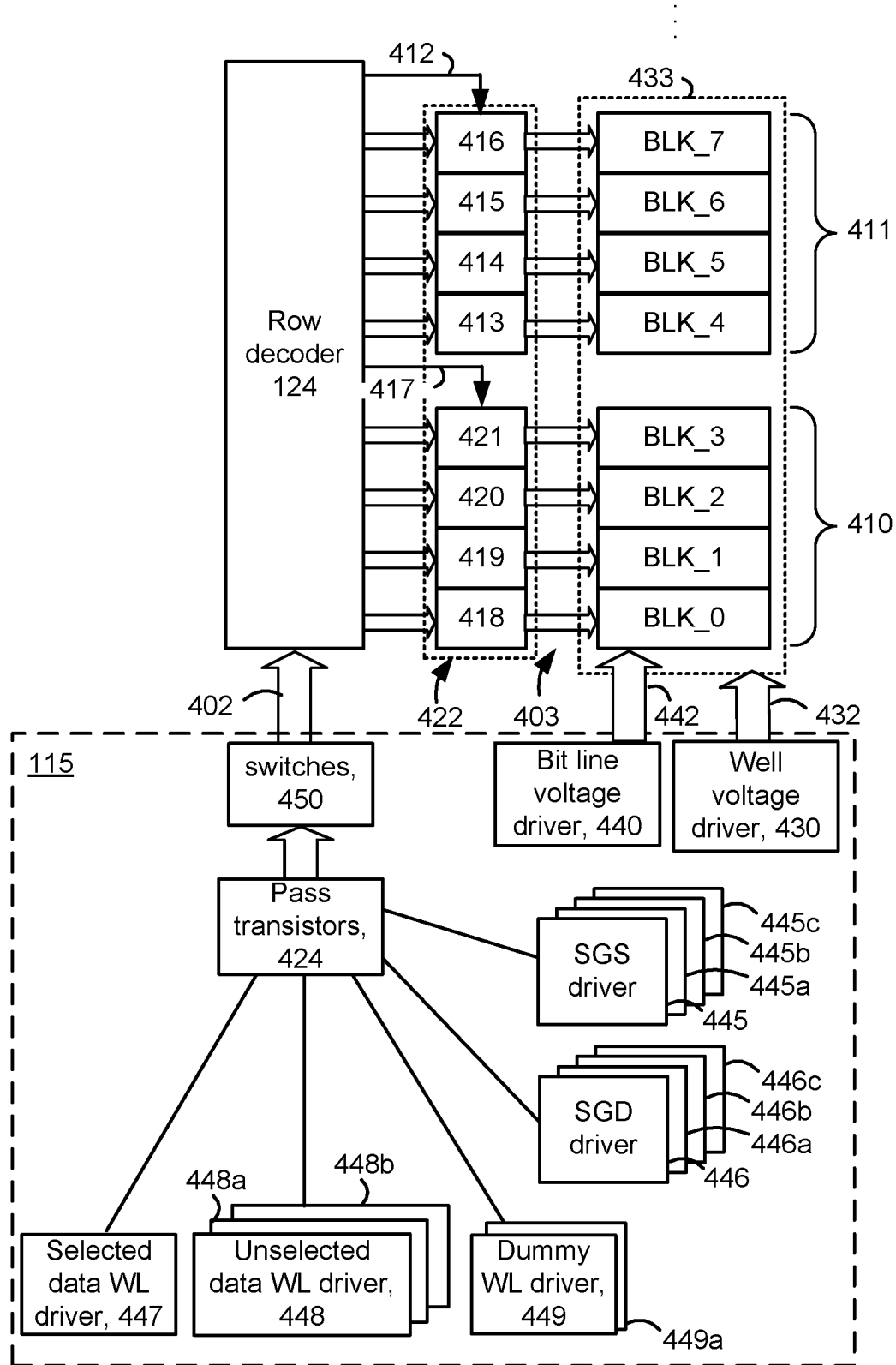
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

Figure 6A:
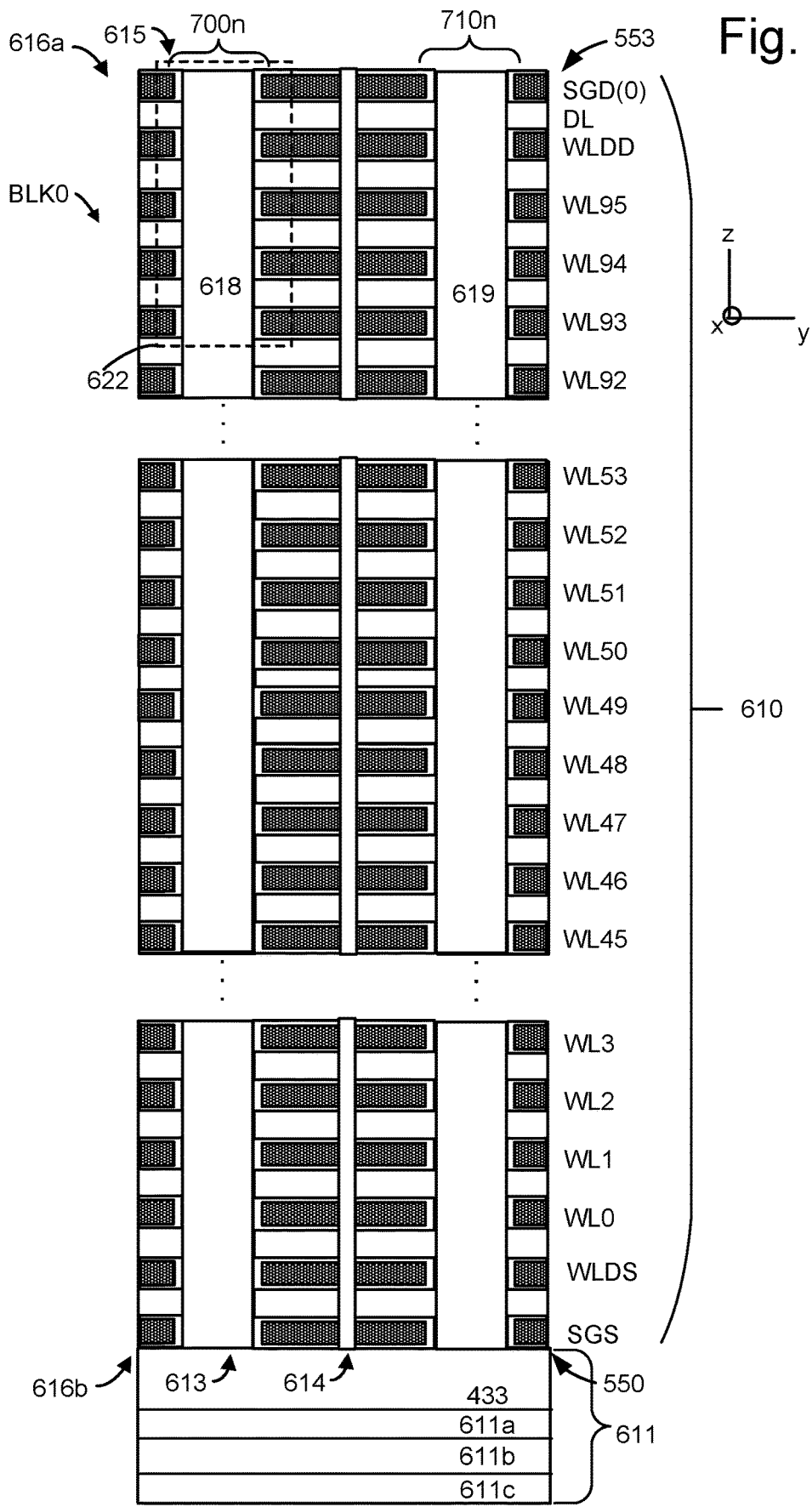
FIG. 6A depicts an example cross-sectional view of a portion of BLK0 of FIG. 4, including NAND strings 700n and 710n.

The voltage drivers can include a selected data word line (WL) driver 447, which provides a voltage on a data word line selected during a program or read operation, drivers 448, 448a and 448b for unselected data word lines, and dummy word line drivers 449 and 449a which provide voltages on dummy word lines WLDD and WLDS, respectively, in FIG. 6A. In one approach, the driver 448 is for WLn−1 the driver 448a is for WLn+1, and the driver 448b is for other, remaining unselected word lines. The drivers 448 and 448a can be used to independently control the pass voltages of WLn−1 and WLn+1 to minimize NWI, as discussed herein.

The voltage drivers can also include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIG. 7. In another option, one SGS driver is common to the different sub-blocks in a block.

The various components, including the row decoder, may receive commands from a controller such as the state machine 112 or the controller 122 to perform the functions described herein.

The well voltage driver 430 provides a voltage Vsl to the well region 611a in the substrate, via control lines 432. In one approach, the well region 433 is common to the blocks. A set of bit lines 442 is also shared by the blocks. A bit line voltage driver 440 provides voltages to the bit lines. In a stacked memory device such as depicted in FIGS. 4 to 7, sets of connected memory cells may be arranged in NAND strings which extend vertically upward from the substrate. The bottom (or source end) of each NAND string is in contact with the well region, and the top end (or drain end) of each NAND string is connected to a respective bit line, in one approach.

Figure 4:
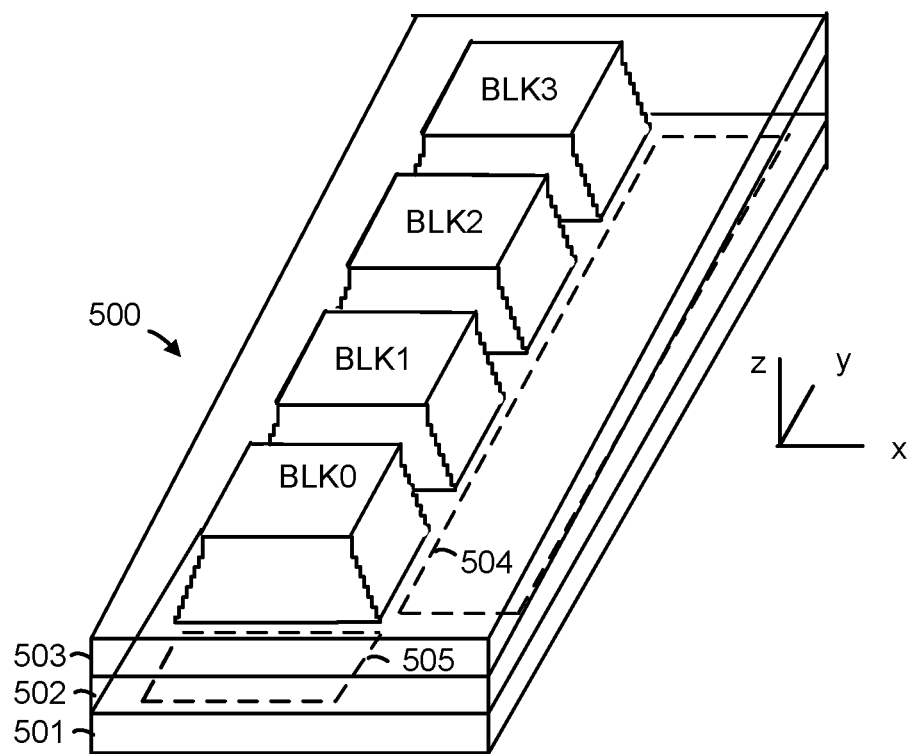
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1A. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
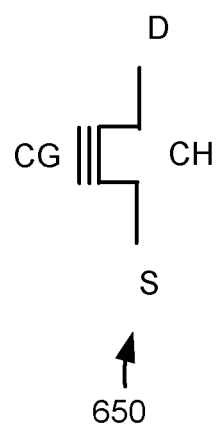
FIG. 5 depicts an example transistor 650.

FIG. 5 depicts an example transistor 650. The transistor comprises a control gate CG, a drain D, a source S and a channel CH and may represent a memory cell or a select gate transistor, for example.

FIG. 6A depicts an example cross-sectional view of a portion of BLK0 of FIG. 4, including NAND strings 700n and 710n. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 553 and bottom 550 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 433 (see also FIG. 3) is an n-type source diffusion layer or well in the substrate. The well region is in contact with a source end of each string of memory cells in a block. The n-type well region 433 in turn is formed in a p-type well region 611a, which in turn is formed in an n-type well region 611b, which in turn is formed in a p-type semiconductor substrate 611c, in one possible implementation. The n-type source diffusion layer may be shared by all of the blocks in a plane, in one approach, and form a source line SL which provides a voltage to a source end of each NAND string.

The NAND string 700n has a source end 613 at a bottom 616b of the stack 610 and a drain end 615 at a top 616a of the stack. Metal-filled slits may be provided periodically across the stack as interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

An insulation-filled region 614 separates the block into sub-blocks, where the NAND strings 700n and 710n are in different sub-blocks.

FIG. 6B depicts a close-up view of the region 622 of the stack of FIG. 6A. Memory cells are formed at the different levels of the stack at the intersection of a word line layer and a memory hole. An SGD transistor 718 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 9A. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. Another option programs all of the memory cells in one sub-block, one word line at a time, before programming the memory cells of the next sub-block. For example, this can involve programming WL0, then WL1 and so forth in SB0, followed by programming WL0, then WL1 and so forth in SB1, and so forth. The word line programming order may start at WL0, the source-end word line and end at WL95, the drain-end word line, for example.

The NAND strings 700n, 710n, 720n and 730n have channels 700a, 710a, 720a and 730a, respectively.

Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 8A depicts control gate layers in the block BLK0, consistent with FIG. 7. The control gate layers are arranged in a stack 800 and include, from top to bottom, SGD layers SGD(0), SGD(1), SGD(2) and SGD(3) in sub-blocks SB0-SB3, respectively, a dummy word lines layer WLDD, data word line layers WL95-WL0, a dummy word line layer WLDS and an SGS layer. Additionally, four example memory holes are depicted in each sub-block. SGD transistors 718, 718a, 718b and 718c are depicted in SGD(0).

Figure 8B:
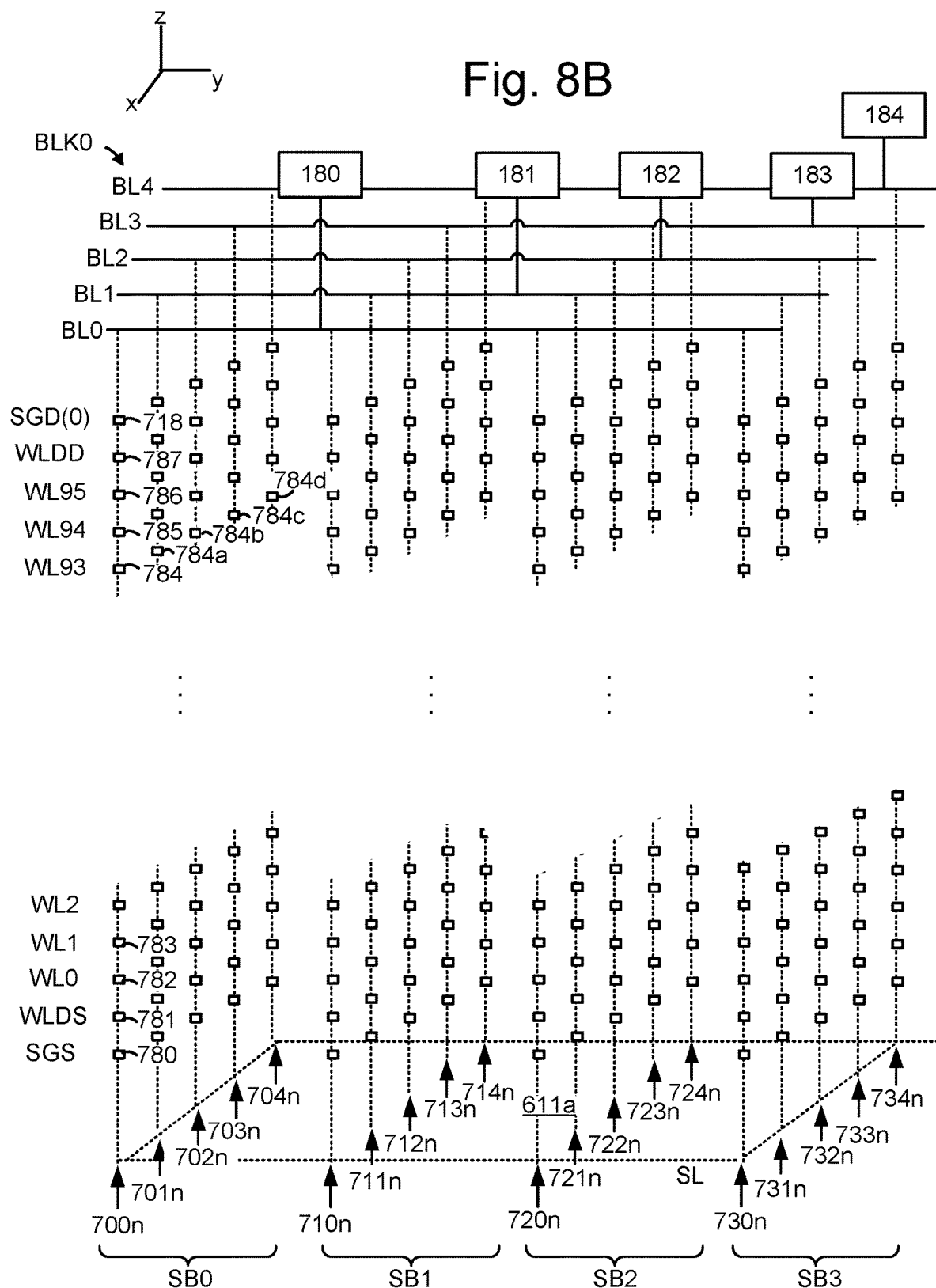
FIG. 8B depicts additional detail of the block BLK0 of FIG. 7.

FIG. 8B depicts additional detail of the block BLK0 of FIG. 7. Example memory cells are depicted which extend in the x direction along word lines in each sub-block. Each memory cell is depicted as a square for simplicity. Sub-blocks SB0, SB1, SB2 and SB3 include NAND strings 700n-704n, 710n-714n, 720n-724n and 730n-734n, respectively. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, a bit line BL3 is connected to NAND strings 703n, 713n, 723n and 733n, and a bit line BL4 is connected to NAND strings 704n, 714n, 724n and 734n. Sense circuits may be connected to each bit line. For example, sense circuits 180-184 (similar to the sense circuits 60-63 of FIG. 2, for example) are connected to bit lines BL0-BL4, respectively. Different bit lines voltages can be used for verify tests of memory cells assigned to adjacent data states as discussed herein, while a common bit line voltage can be used for memory cells assigned to all data states in a subsequent read operation.

Programming and reading can occur for selected cells in one word line and one sub-block at a time. This allows each selected cell to be controlled by a respective bit line and/or source line. For example, a set of memory cells, which includes example memory cells 784, 784a, 784b, 784c and 784d is connected to WL93 as an example selected word line in SB0. A set of memory cells may be programmed or read concurrently. An additional set of memory cells is connected to WL93 in each of the other sub-blocks SB1-SB3.

In this example, the source line SL or source region (well region 611a) is driven at a voltage Vsource.

Each NAND string includes one or more SGD transistors at the drain-end and one or more SGS transistors at the source end. Each SGD transistor may be connected to separate control line layer, as in FIG. 8A, so that it can be driven separately.

The NAND string 700n includes an SGD transistor 718 connected to select gate lines SGD(0), dummy memory cell 787 connected to WLDD, and data memory cells 786, 785, 784, 783 and 782 connected to WL95, WL94, WL93 . . . WL1 and WL0, respectively. The NAND string 700n also includes a dummy memory cell 781 connected to WLDS and an SGS transistor 780 connected to a select gate line SGS. BL0-BL4 are respective bit lines connected to the NAND strings 700n-704n, respectively.

FIG. 9A depicts an example of an ideal set of Vth distributions of a set of memory cells having eight data states. In FIGS. 9A-9E and 9H-9J, the vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 900. After the program operation is successfully completed, the memory cells assigned to the A-G states are represented by the Vth distributions 901-907. The memory cells assigned to the erased state continue to be represented by the Vth distribution 900.

The memory cells which are programmed to the A-G states have a Vth distribution in which the lower tail is aligned with the verify voltages of VvA-VvG, respectively. These Vth distributions are obtained just after completion of the program operation, and assume no program disturb or neighbor word line interference has occurred. Read voltages VrA-VrG can be used for reading the states of the memory cells in a read operation. The verify voltages and read voltages are examples of program parameters for three-bit per cell operations.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase verify voltage, VvEr, which is applied to the word lines.

The Er-G states are examples of assigned data states, and the A-G states are examples of programmed data states, in this eight state example. The number of data states could be higher or low than eight data states.

One approach to achieving the Vth distribution of FIG. 9A is to perform a verify test for each data state which uses a different verify voltage applied to the word line. However, as mentioned at the outset, the program time can be reduced by performing a verify test concurrently for memory cells assigned to a pair of adjacent data states, such as pairs 940, 941 and 942 which comprise the A and B states, C and D states and E and F states, respectively. Each pair of data states includes a lower state, e.g., A, C and E, which is verified using Vbl_norm and an upper state which is verified using Vbl_el, for instance. Thus, the A and B states are verified concurrently, the C and D states are verified concurrently and the E and F states are verified concurrently. The techniques described herein can be extended to groups of more than two adjacent states as well.

FIG. 9B depicts an example of a set of Vth distributions of a set of memory cells having eight data states, where the Vth distribution is wider for some data states when a bit line voltage used in a read operation is lower than the bit line voltage used in the verify test. The Vth distribution is wider than the ideal case of FIG. 9A when the memory cells are read after programming because Vbl_norm is used in the read operation for all data states. In particular, the Vth distributions 902a, 904a and 906a for the B, D and F states are wider than in FIG. 9A due to an upshift in the upper tail of the Vth distributions. This can result in read errors, as mentioned.

FIG. 9C depicts a natural Vth distribution 910 for memory cells assigned to the B state, showing low-, medium- and high-DIBL memory cells in regions 910L, 910M and 910H, respectively. DIBL refers to a characteristic of transistors in which the Vth is lowered as the drain (e.g., bit line) voltage is increased. Additionally, it has been observed that the magnitude of the DIBL can vary for different memory cells due to variations in physical properties such as control gate length, polysilicon channel properties and oxide thickness. These variations result from the fabrication process. Moreover, in a natural Vth distribution 910 of a set of B-state memory cells, for example, the memory cells with a higher Vth, at the upper tail of the Vth distribution, tend to have a higher DIBL and the memory cells with a lower Vth, at the lower tail of the Vth distribution, tend to have a lower DIBL. The B-state memory cells typically reach the natural Vth distribution after one or two program pulses and remain in the distribution until the memory cells pass the verify test and reach the lockout state. In the natural Vth distribution, the full range of program speeds of the memory cells can be observed.

Note that memory cells assigned to other data states can also be represented by a natural Vth distribution similar to the natural Vth distribution 910.

FIG. 9D depicts the Vth distribution 902 of FIG. 9A, showing low-, medium- and high-DIBL memory cells in regions 902L, 910M and 910H, respectively, where the high-DIBL memory cells are in the upper tail of the Vth distribution. When the B-state memory cells pass the verify test, the high and low DIBL cells will continue to be in the upper and lower tails, respectively, of the Vth distribution.

The B-state memory cells are verified using Vbl_el but the Vbl is not stepped up as depicted in FIG. 11A-11C.

FIG. 9E depicts the Vth distribution 902a of FIG. 9B for memory cells assigned to the B state, showing low-, medium- and high-DIBL memory cells in regions 912L, 912M and 912H, respectively, where the Vth distribution width Vth_w1 is increased compared to the Vth distribution width FIG. 9D. When the lower bit line voltage is used during the reading of the B-state memory cells, the Vth will be upshifted. In particular, the memory cells which are represented by the region 902H in FIG. 9D will be represented by the upshifted and widened region 912H. The medium DIBL memory cells which are represented by the region 902M in FIG. 9D will be represented by the region 912M which is upshifted and widened by a lesser amount than for the high DIBL cells. The low DIBL memory cells which are represented by the region 902L in FIG. 9D will be represented by the region 912L which is upshifted and widened by a lesser amount than for the medium DIBL cells.

FIG. 9F depicts a plot of Vth in the natural Vth distribution of FIG. 9C versus DIBL. DIBL can be expressed as a negative number with units such as mV/V, e.g., dVth/DVbl. As mentioned in connection with FIG. 9C, the memory cells with a higher magnitude of DIBL will tend to have a higher Vth and therefore be represented by the upper tail of the natural Vth distribution.

FIG. 9G depicts a plot of data state, P-E cycles and temperature versus DIBL. DIBL can also vary due to other factors. For example, DIBL can be slightly higher in magnitude for memory cells assigned to higher data states. Also, DIBL can be higher in magnitude when the number of program-erase (P-E) cycles of a block is higher, e.g., due to deterioration of the memory cells which allows the Vth to increase more easily. Also, DIBL can be higher in magnitude when the ambient temperature of the memory device is lower, e.g., below a room temperature such as 25 C. At lower temperatures, electrons encounter fewer scattering events and therefore a higher probability of being injected into the charge-trapping layer of a memory cell.

FIG. 9H depicts the Vth distribution 902 of FIG. 9A, showing high, medium and low-DIBL memory cells in regions 922H, 922M and 922L, respectively, where the high-DIBL memory cells are in the lower tail of the Vth distribution. This Vth distribution is obtained after the natural Vth distribution of FIG. 9C. The position of the high and low DIBL memory cells in the Vth distribution is reversed compared to the Vth distribution of FIG. 9D. This can be achieved by stepping up the bit line voltage for the B state memory cells such as depicted in FIG. 11A-11C. When the high DIBL B-state memory cells are subject to a verify test, the Vbl will be relatively low, at the minimum level of Vbl_el_min (FIG. 11A). As a result, the current in the NAND string is relatively low and the memory cell will lockout when the Vth is relatively low. Similarly, when the low DIBL B-state memory cells are subject to a verify test, the Vbl will be at a relatively high level, e.g., at Vbl_el_max (FIG. 11A). As a result, the current in the NAND string is relatively high and the memory cell will lockout when the Vth is relatively high. The high DIBL cells will tend to lockout first, followed by the medium DIBL cells and then the low DIBL cells.

FIG. 9I depicts a Vth distribution 932 for memory cells in the Vth distribution 902 of FIG. 9H, showing high, medium and low-DIBL memory cells in regions 932H, 932M and 932L, respectively, where the Vth distribution width is increased compared to the Vth distribution width FIG. 9H, but the Vth distribution width Vth_w2 is less than the Vth distribution width Vth_w1 in FIG. 9E. Advantageously, the use of an increasing bit line voltage during the verify tests for the B-state (or generally, the upper state in a pair or other set of adjacent data states which are verified concurrently) can reduce the Vth distribution width so that read errors are reduced. There is still some widening because of the DIBL effect, but since the high DIBL cells are placed in the region 922H in the lower tail of the Vth distribution, when their Vth is upshifted in the read operation, the upshift does not increase the upper tail. Instead, the Vth of the high DIBL cells upshifts toward the center of the Vth distribution. The upshift at the upper tail is minimized since the low DIBL cells, which have the smallest upshift, are represented at the region 922L of the upper tail.

FIG. 9J depicts the natural Vth distribution 910 of FIG. 9C, showing five regions 910a-910e, where the memory cells of each region are verified using a different bit line voltage such as by using the increasing bit line voltage of FIG. 11A-11C. In these examples, five bit line voltages are used. Generally, two or more different bit line voltages can be used in the verify tests of the upper state cells for each pair of adjacent data states. The B-state cells with the highest through lowest DIBL are represented by the regions 910a-910e, respectively, and are subject to a verify test using bit line voltages of Vbl_el_min, Vbl1, Vbl2, Vbl3 and Vbl_el_max, respectively, in FIG. 11A, for example.

FIG. 10A depicts an example voltage signal in a program operation. The voltage signal can be used in a single pass program operation or in one pass of a multi-pass program operation. The program operation can be used to program memory cells to threshold voltages such as depicted in FIGS. 9A-9E and 9H-9J. The horizontal axis denotes a program loop (PL) number, ranging from 1-18, and the vertical axis denotes voltage. During a program operation, program loops are performed for a selected word line in a selected sub-block. A program loop comprises a program portion in which a program voltage or pulse is applied to the selected word line followed by a verify portion in which a verify signal or pulse is applied to the selected word line while one or more verify tests, referred to as program-verify tests, are performed for the associated memory cells. As mentioned, a verify test may be performed concurrently for memory cells assigned to a pair of adjacent data states while applying one verify voltage to the word line.

The voltage signal 1000 includes a series of program voltages, including an initial program voltage 1001, which are applied to a word line selected for programming. In this example, the voltage signal includes program voltages which increase stepwise in amplitude in one or more program loops of a programming pass using a fixed or varying step size. This is referred to as incremental step pulse programming, where the program voltage (Vpgm) starts at an initial voltage, Vpgm_init, and increases in a step in each successive program loop, for instance, until the program operation is completed. A fixed step size of dVpgm is depicted. A successful completion occurs when the threshold voltages of the selected memory cells reach the verify voltages of the assigned data states. A program operation can include a single programming pass or multiple programming passes, where each pass uses incremental step pulse programming, for instance.

Figure 10B:
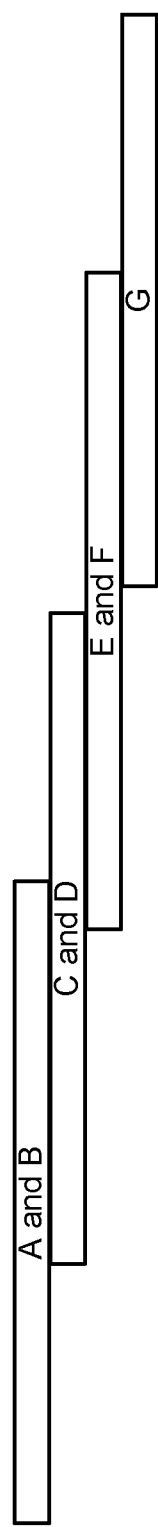
FIG. 10B depicts an example of data states which are verified in the different program loops of FIG. 10A.

The verify signal in each program loop, including example verify signal 1002, can include one or more verify voltages, based on the assigned data states which are being verified for the program loop. The verify tests can encompass lower pairs of data states, e.g., A and B states, and then midrange pairs of data states, e.g., C and D states, and then higher pairs of data states, e.g., E and F states, as the program operation proceeds, such as depicted in FIG. 10B. The example verify signals depict three verify voltages as a simplification.

All memory cells may initially be in the erased state at the beginning of the program operation, for instance. After the program operation is completed, a Vth distribution similar to that in FIG. 9A is achieved, and the data can be read from the memory cells using read voltages. During a read operation, a read pass voltage, Vpass (e.g., 8-10 V), also referred to as a turn on voltage, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

With eight data states, or three bits per cell, three pages of data can be stored. An example encoding of bits for the Er, A, B, C, D, E, F and G states is 111, 110, 100, 000, 010, 011, 001 and 101, respectively. In each three-bit sequence, the UP bit is followed by the MP bit and then the LP bit. The data of the lower, middle and upper pages can be determined by reading the memory cells using read voltages of VrA and VrE; VrB, VrD and VrF; and VrC and VrG, respectively.

FIG. 10B depicts an example of data states which are verified in the different program loops of FIG. 10A. The horizontal bars are time-aligned with the program loop axis of FIG. 9A. The A and B state memory cells are verified while VvA is applied to the selected word line in PL1-8, the C and D state memory cells are verified while VvC is applied to the selected word line in PL4-11, the E and F state memory cells are verified while VvE is applied to the selected word line in PL8-15 and the G state memory cells are verified while VvG is applied to the selected word line in PL12-18.

FIG. 11A depicts a plot of bit line voltages used during verify tests consistent with FIGS. 10A and 10B, where Vbl_norm is used for the A, C, E and G states and a common set of increasing bit line voltages with a common fixed step size (dV) is used for the B, D and F states. In FIG. 11A-11C, the vertical axis depicts a bit line voltage used during a verify test of a program loop and the horizontal axis depicts a program loop number. Vbl_norm (e.g., 0.5 V) is used for verify tests of the memory cells which assigned to the lower data states in the pairs of adjacent data states, e.g., the A, C and E states, and for the memory cells which are assigned to the G state, which is not in a pair of adjacent data states which are concurrently verified. Using Vbl_norm, the A state is verified when PL=1-5, the C state is verified when PL=5-10, the E state is verified when PL=10-13 and the G state is verified when PL=13-18. Vbl_norm is a fixed voltage in the verify tests of the program loops.

The upper data states of the pairs of adjacent data states are verified using an increasing bit line voltage. The bit line voltage increases over the program loops, and ranges from Vbl_el_min (e.g., 5 V) to Vbl_el_max (e.g., 6 V), a difference of d. This is the difference between the lowest and highest values of the voltages on the bit lines. For the B and D states, the bit line voltage is different in each program loop in which these states are verified. For the F state, the bit line voltage is different in each program loop until the last two program loops (PL14 and PL15) in which this state is verified. Once the bit line voltage reaches the maximum level, Vbl_el_max, it can be maintained at that level in subsequent verify tests until the verify tests are completed for the pair of adjacent data states. Generally, it is also possible for the same bit line voltage to be used in multiple successive program loops. Other options include stepping up the bit line voltage over successive program loops, then maintaining the same bit line voltage in successive program loops, and then stepping up the bit line voltage again over successive program loops. Also, the number of step increases of Vbl can be the same or different for the different pairs of adjacent data states. In this example, there are four step increases.

The B state memory cells are subject to a verify test using bit line voltages of Vbl_el_min, Vbl1, Vbl2, Vbl3 and Vbl_el_max in PL3-7, respectively. The D state memory cells are subject to a verify test using Vbl_el_min, Vbl1, Vbl2, Vbl3 and Vbl_el_max in PL6-10, respectively. The F state memory cells are subject to a verify test using Vbl_el_min, Vbl1, Vbl2, Vbl3 and Vbl_el_max in PL10-14, respectively, and using Vbl_el_max again in PL15.

FIG. 11A provides an example in which a first memory cell is verified using successively higher voltages Vbl_el_min, Vbl1, Vbl2, Vbl3 and Vbl_el_max on a first bit line.

FIG. 11B depicts a plot of bit line voltages used during verify tests consistent with FIGS. 10A and 10B, where Vbl_norm (not shown) is used for the A, C, E and G states and a common set of increasing bit line voltages with a common progressively increasing step size is used for the B, D and F states. In FIGS. 11B and 11C, Vbl_norm is not depicted on the vertical axis. The verification of the A, C and E states using Vbl_norm is the same as in FIG. 11A.

The step size increases in progressively larger steps from dV1 to dV4, where dV4>dV3>dV2>dV1. In this approach, Vbl is kept relatively low for more program loops. This can account for a non-linear relationship between the position of the cells in the natural Vth distribution and their DIBL. For example, some memory cells in the middle of the natural Vth distribution may have a relatively high DIBL and these cells will not reach the lockout state until a later program loop, relative to the high DIBL cells at the upper tail of the natural Vth distribution. By keeping the bit line voltage relatively low for more program loops, these cells can be locked out at a low Vth to prevent them from moving into the upper tail of the final Vth distribution.

The B state memory cells are subject to a verify test using bit line voltages of Vbl_el_min, Vbl1*a*, Vbl2*a*, Vbl3*a* and Vbl_el_max in PL3-7, respectively. The D state memory cells are subject to a verify test using Vbl_el_min, Vbl1*a*, Vbl2*a*, Vbl3*a* and Vbl_el_max in PL6-10, respectively. The F state memory cells are subject to a verify test using Vbl_el_min, Vbl1*a*, Vbl2*a*, Vbl3*a* and Vbl_el_max in PL10-14, respectively, and using Vbl_el_max again in PL15.

FIG. 11B provides an example in which a first memory cell is verified using successively higher voltages Vbl_el_min, Vbl1*a*, Vbl2*a*, Vbl3*a* and Vbl_el_max on a first bit line.

FIG. 11C depicts a plot of bit line voltages used during verify tests consistent with FIGS. 10A and 10B, where Vbl_norm (not shown) is used for the A, C, E and G states and a different set of increasing bit line voltages with different minimum voltages and different step sizes is used for the B, D and F states, where the minimum voltage is lower and the step size is higher for higher data states. The verification of the A, C and E states using Vbl_norm is the same as in FIG. 11A.

In this example, the minimum voltages are Vbl_el_minB, Vbl_el_minD and Vbl_el_minE for the B, D and C states, respectively. The maximum voltage, Vbl_el_max, is the same for these states. The minimum bit line voltage is relatively lower when the data state is relatively higher.

For a given data state, the Vbl step size is fixed, e.g., at dVB, dVD and dVF for the B, D and E states, respectively. However, the Vbl step sizes are different for the different states. In this example, the Vbl step size for the B state, dVB, is less than the Vbl step size for the D state, dVD, and dVD is less than the Vbl step size for the F state, dVF. The step size is relatively larger when the data state is relatively higher.

The difference between the lowest and highest bit line voltages for the B, D and F states is d, d1 and d2, respectively. The difference is relatively larger when the data state is relatively higher.

The B state memory cells are subject to a verify test using bit line voltages of Vbl_el_minB, Vbl1B, Vbl2B, Vbl3B and Vbl_el_max in PL3-7, respectively. The D state memory cells are subject to a verify test using Vbl_el_minD, Vbl1D, Vbl2D, Vbl3D and Vbl_el_max in PL6-10, respectively. The F state memory cells are subject to a verify test using Vbl_el_minF, Vbl1F, Vbl2F, Vbl3F and Vbl_el_max in PL10-14, respectively, and using Vbl_el_max again in PL15.

This approach compensates for the observation of FIG. 9G in which the DIBL is greater for higher data states. By using a lower Vbl_el_min for higher data states, a greater compensation is provided for the higher DIBL of these cells. See also FIG. 11D.

FIG. 11C provides an example in which a first memory cell assigned to the B state is verified using successively higher voltages Vbl_el_minB, Vbl1B, Vbl2B, Vbl3B and Vbl_el_max on a first bit line. Also, a first memory cell assigned to the D state is verified using successively higher voltages Vbl_el_minD, Vbl1D, Vbl2D, Vbl3D and Vbl_el_max on a first bit line. Also, a first memory cell assigned to the F state is verified using successively higher voltages Vbl_el_minF, Vbl1F, Vbl2F, Vbl3F and Vbl_el_max on a first bit line.

FIG. 11D depicts a plot of Vbl_el_min versus data state, P-E cycles and temperature, consistent with FIG. 9G. As mentioned, DIBL is higher when the data state or number of P-E cycles is higher, and when the temperature is lower. FIG. 11C provided an example in which Vbl_el_min is set lower when the data state is higher. Generally, any of the values of Vbl_el_min in FIG. 11A-11C can be adjusted according to the plot of FIG. 11D. Vbl_el_min can be made lower when the data state or number of P-E cycles is higher, and/or when the temperature is lower, to compensate for the increased DIBL. The adjustment of Vbl_el_min may be made with the condition that Vbl_el_max is fixed, in one approach.

As an example, consider the first sense circuit 180 of FIG. 8B connected to a B-state memory cell 784 being programmed. In one approach, the first sense circuit is configured to set a relatively low Vbl_el_min on the first bit line when a number of P-E cycles of the set of memory cells in relatively high. For example, this can involve setting Vbl_el_min as a decreasing function of the number of P-E cycles. This can involve setting Vbl_el_min to one level when the number of P-E cycles is below a threshold number of P-E cycles and to another, lower level when the number of P-E cycles is at or above the threshold number of P-E cycles.

In another approach, the first sense circuit is configured to set a relatively low Vbl_el_min when an assigned data state of a first memory cell being verified is relatively high. For example, this can involve setting Vbl_el_min as a decreasing function of the data state. This can involve setting Vbl_el_min to one level when the data state is below a threshold data state and to another, lower level when the data state is at or above the threshold data state. The data states extend from the lowest state, the erased state, to the highest state, the G state, for instance. A state is relatively high when the Vth values which represent the state are relatively high.

In another approach, the first sense circuit is configured to set a relatively low Vbl_el_min when a temperature is relatively low. For example, this can involve setting Vbl_el_min as an increasing function of the temperature. This can involve setting Vbl_el_min to one level when the temperature is above a threshold temperature and to another, lower level when the temperature is at or below the threshold temperature.

FIG. 11E depicts a plot of D=Vbl_el_max−Vbl_el_min versus data state, P-E cycles and temperature, consistent with FIG. 9G. A difference D between Vbl_el_max and Vbl_el_min can also be adjusted to be higher when the data state or number of P-E cycles is higher, and when the temperature is lower. In this case, Vbl_el_max and/or Vbl_el_min can be adjusted.

In one approach, the first sense circuit is configured to set a relatively large difference when a number of P-E cycles of the set of memory cells in relatively high. For example, this can involve setting the difference as an increasing function of the number of P-E cycles. This can involve setting the difference to one level when the number of P-E cycles is below a threshold number of P-E cycles and to another, higher difference when the number of P-E cycles is at or above the threshold number of P-E cycles.

In another approach, the first sense circuit is configured to set a relatively large difference when an assigned data state of a first memory cell being verified is relatively high. For example, this can involve setting the difference as an increasing function of the data state. This can involve setting the difference to one level when the data state is below a threshold data state and to another, higher difference when the data state is at or above the threshold data state.

In another approach, the first sense circuit is configured to set a relatively large difference when a temperature is relatively low. For example, this can involve setting the difference as a decreasing function of the temperature. This can involve setting the difference to one level when the temperature is above a threshold temperature and to another, higher difference when the temperature is at or below the threshold temperature.

The above approaches of FIGS. 11D and 11E can be used separately or in combination.

Figure 12A:
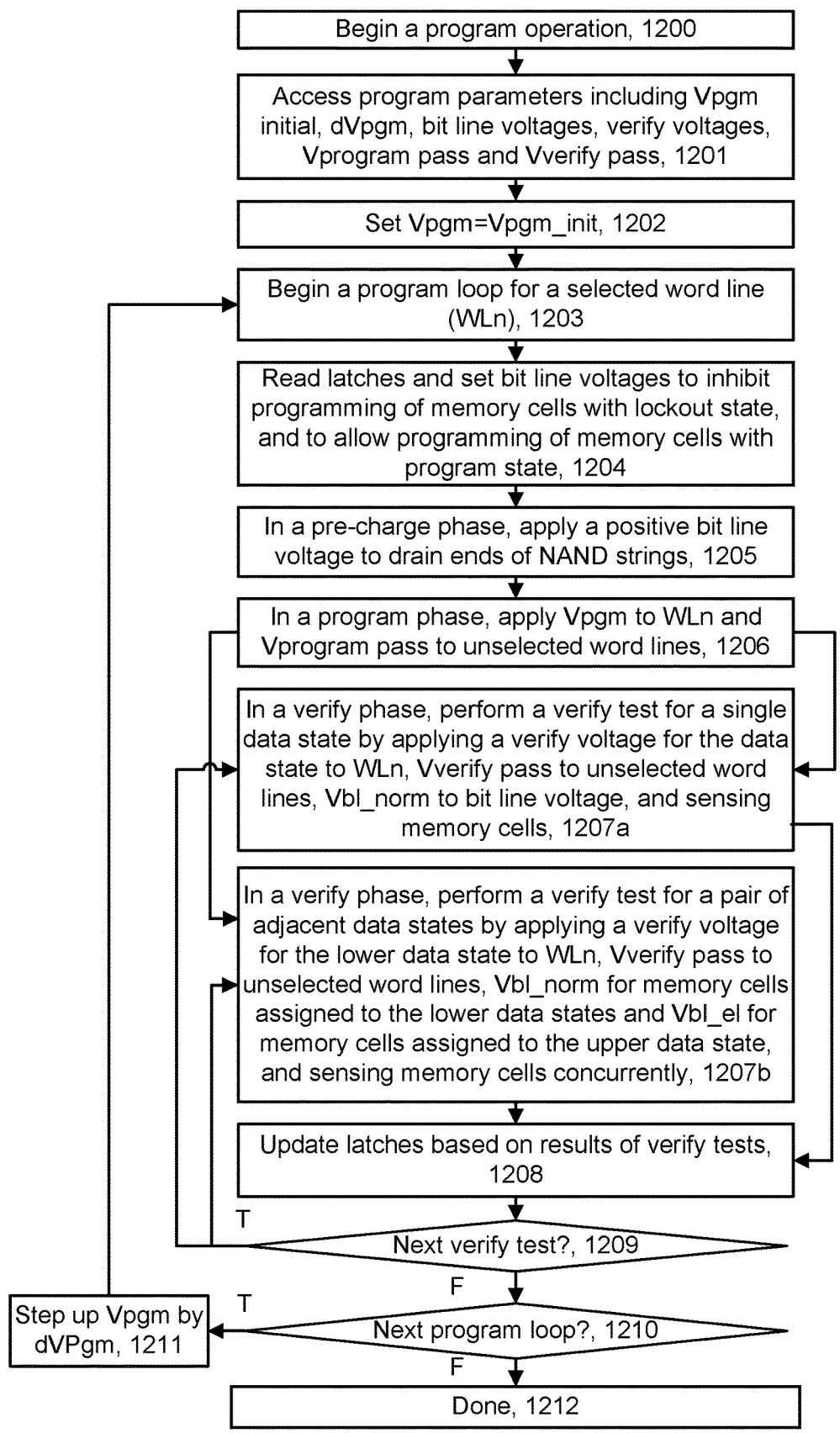
FIG. 12A depicts an example program operation consistent with FIG. 11A-11C.

FIG. 12A depicts an example program operation consistent with FIG. 11A-11C. A program operation begins at step 1200. Step 1201 includes accessing program parameters including Vpgm initial, dVpgm, bit line voltages, verify voltages, Vprogram pass and Vverify pass. For example, these parameters may be accessed from the storage location 113 by the state machine 112 (FIG. 1A). Step 1202 sets the current value of Vpgm to Vpgm_init. Step 1203 begins a program loop for a selected word line (WLn). Step 1204 includes reading the latches of the selected memory cells, e.g., to determine whether the memory cells are in a lockout or program state. The step also includes setting bit line voltages to inhibit programming of memory cells with the lockout state, e.g., by setting Vbl=2 V, and to allow programming of memory cells with the program state, e.g., by setting Vbl=0 V. Step 1205 includes performing a pre-charge phase by applying a positive bit line voltage to the drain ends of the NAND strings. See FIG. 14D.

Step 1206 includes, in a program phase, applying Vpgm to WLn and Vprogram pass to unselected word lines (see FIGS. 14A and 14B). Subsequently, step 1207*a* or 1207*b* is followed. Step 1207*a* is for a verify test of a single data state such as the G state. Step 1207*b* is for a verify test of a pair of adjacent data states. Step 1207*a* includes, in a verify phase, performing a verify test for a single data state by applying a verify voltage for the data state to WLn, Vverify pass to unselected word lines, and Vbl_norm to the bit line voltage, and sensing the memory cells. For example, the verify voltage could be VvG, consistent with FIG. 11A-11C, for verifying the G state memory cells.

Step 1207*b* includes, in a verify phase, performing a verify test for a pair of adjacent data states by applying a verify voltage for the lower data state to WLn, Vverify pass to unselected word lines, Vbl_norm for memory cells assigned to the lower data state and Vbl_el for memory cells assigned to the upper data state, and sensing the memory cells assigned to the pair of adjacent data states concurrently. For example, the verify voltage can be VvA, VvC or VvE when the pair of adjacent data states is A and B, C and D, and E and F, respectively. For example, referring to FIGS. 8A and 8B, assume WL93 is the selected word line, a first memory cell 784 in a first NAND string 700*n* is assigned to the B state and a second memory cell 784*a* in a second NAND string 701*n* is assigned to the A state. The sense circuit 180 is a first sense circuit connected to the first NAND string via a first bit line (BL0), and the sense circuit 181 is a second sense circuit connected to the second NAND string via a second bit line (BL1). The first and second bit lines are connected to the first and second NAND strings, respectively.

During the verify test, VvA is applied to WL93, an elevated voltage Vbl_el is applied to BL0 and Vbl_norm is applied to BL1.

Step 1208 follows step 1207*a* or 1207*b*. Step 1208 includes updating the latches based on the results of the verify tests. For example, the latches can be updated from the program state to the lockout state for memory cells which pass a verify test. A decision step 1209 determines if there is a next verify test. For example, predetermined verify tests can be performed at predetermined program loops as depicted in FIG. 11A-11C. Referring to PL5 in FIG. 10B, for example, verify tests will be performed for the A and B states, and then for the C and D states.

If the decision step 1209 is true, a next verify test is performed at step 1207*a* or 1207*b*. If the decision step 1209 is false, a decision step 1210 determines if there is a next program loop. A next program loop may be performed if many memory cells have not completed programming or are otherwise not in the lockout state. If decision step 1210 is true, step 1211 includes stepping up Vpgm by dVpgm, and a next program loop begins at step 1203. If decision step 1210 is false, step 1212 denotes the end of the program operation. The program operation may be ended when all, or nearly all of the memory cells connected to WLn are in the lockout state.

Figure 12B:
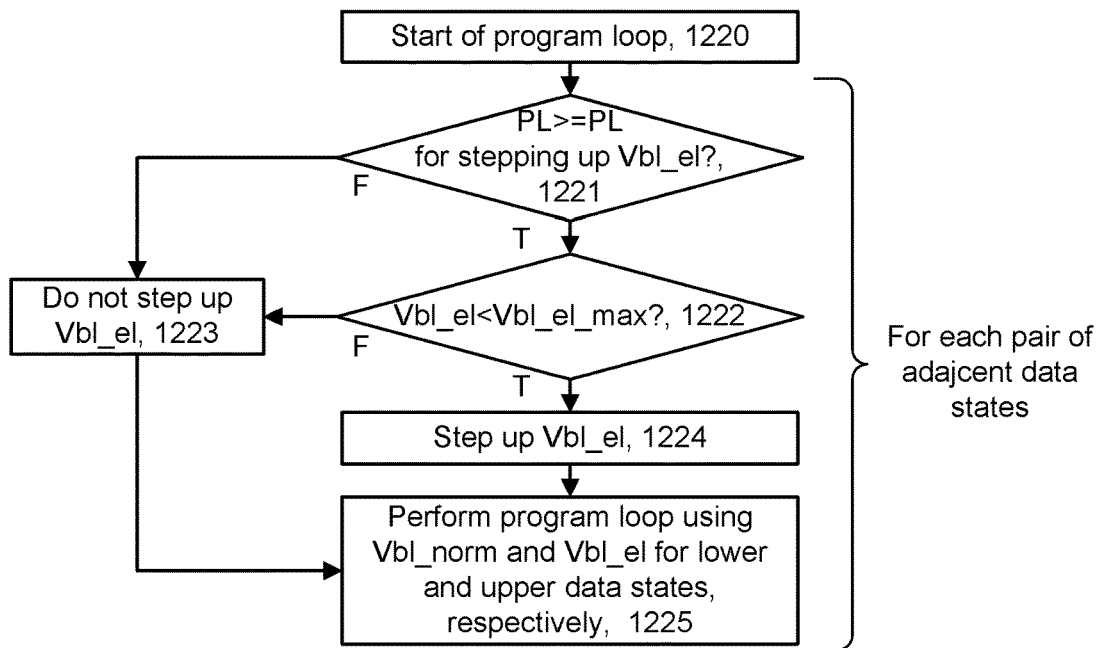
FIG. 12B depicts an example process for setting bit line voltages for pairs of adjacent data states in the program operation of FIG. 12A, consistent with FIG. 11A-11C.

FIG. 12B depicts an example process for setting bit line voltages for pairs of adjacent data states in the program operation of FIG. 12A, consistent with FIG. 11A-11C. In one approach. the verify tests are performed for predetermined data states at predetermined program loop numbers, so that the elevated bit line voltages are set based on the program loop number. For example, the verify tests can be performed according to predetermined program loop numbers such as in FIGS. 10B and 11A-11C. In FIG. 10B, the verify tests for the C and D states are predetermined, before the programming, to begin at PL4. In another approach, the decision to begin a verify test is based on a measured program progress of the memory cells during the program operation. For example, the verify tests for the C and D states can be set to begin when a specified portion of the A and B state cells have reached the lockout state.

Step 1220 denotes the start of a program loop. A decision step 1221 determines if the current program loop number (PL) is greater than or equal to a PL number for stepping up Vbl_el. If the decision step 1221 is true, a decision step 1222 determines if the current value of Vbl_el is less than the maximum value, Vbl_el_max. If the decision step 1222 is true, Vbl_el is stepped up at step 1224. Step 1225 performs the program loop using Vbl_norm and Vbl_el for lower and upper data states, respectively, in a pair of adjacent data states. If the decision step 1221 or 1222 is false, Vbl_el is not stepped up at step 1223.

In the example of FIGS. 10B and 11A-11C, Vbl_el is stepped up for the B, D and F states starting at PL=4, 7 and 11, respectively, so this is the PL number for stepping up Vbl_el in decision step 1221. The decision step 1222 avoids stepping up Vbl_el if it is already at the maximum allowed level, Vbl_el_max. Steps 1221-1225 can be performed for each pair of adjacent data states.

Figure 13:
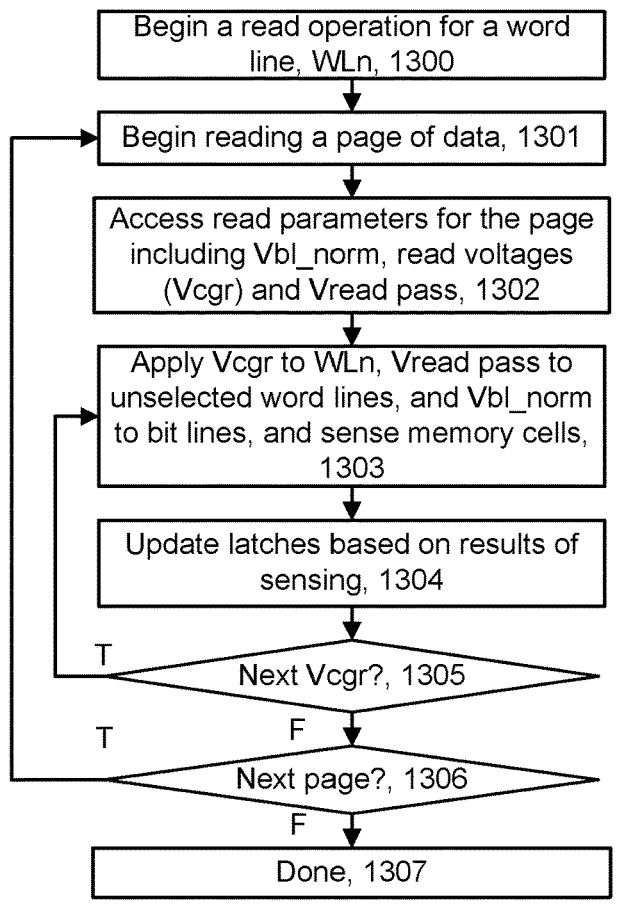
FIG. 13 depicts an example read operation which follows the program operation of FIG. 12.

FIG. 13 depicts an example read operation which follows the program operation of FIG. 12. Step 1300 begins a read operation for a word line, WLn. Reading can occur separately for different portions of a word line in different sub-blocks. Generally, a read operation can involve reading one or more pages of data. Step 1301 includes beginning to read a page of data from the selected word line. Step 1302 includes accessing read parameters for the page including Vbl_norm, read voltages (Vcgr) and Vread pass. For example, the state machine could access the read parameters from the storage location 113. Step 1303 includes applying a control gate read voltage (see FIG. 15A) to WLn, and Vread pass to the unselected word lines (see FIG. 15B), and sensing the memory cells. Step 1304 updates the latches based on the results of the sensing, e.g., based on whether the memory cells are in a conductive or on-conductive state. A decision step 1305 determines if there is a next Vcgr to apply to WLn in reading the current page. If the decision step 1305 is true, a next read or sensing is performed at step 1303. If the decision step 1305 is false, a decision step 1306 determines if there is a next page to read. If this is true, step 1301 is reached. If decision step 1306 is false, step 1307 denotes the end of the read operation.

FIG. 14A-14D depicts examples of voltage signals which can be used in a program operation, consistent with FIGS. 12A and 12B. The vertical dimension denotes voltage and the horizontal dimension denotes time, with time points t0-t10. The period of time depicted corresponds to one program loop and includes a pre-charge phase 1490 (t0-t2), a program phase 1491 (t2-t8) and a verify phase 1492 (t8-t10). Example voltages of the signals are also depicted. A voltage signal 1400 represents VWLn, the voltage of the selected word line, a voltage signal 1410 represents Vwl_unsel, a voltage of unselected word lines, a voltage signal 1420 represents the select gate voltages, e.g., Vsgd and/or Vsgs, and a voltage signal 1430 represents Vbl, a bit line voltage.

FIG. 14A depicts voltages applied to a selected word line. The voltage signal 1400 is represented by a plot 1401 at an initial voltage such as 0 V, a plot 1402 representing a program pass voltage, Vprogram-pass, a plot 1403 representing a peak level of Vpgm, and plots 1404 and 1405 representing verify voltages of VvA and VvC, respectively, for use in the verify phase. A program pulse comprises the plots 1402 and 1403 in the program phase 1491.

FIG. 14B depicts voltages applied to unselected word lines. The voltage signal 1410 is represented by a plot 1411 at an initial voltage such as 0 V. During the program phase, a plot 1412 represents a Vprogram-pass. During the verify phase, a plot 1413 represents Vverify-pass, a verify pass voltage, during the application of the verify voltages VvA-VvC.

FIG. 14C depicts voltages applied to select gate transistors. The voltage signal 1420 is represented by a plot 1421, e.g., at 6 V, during the pre-charge for selected and unselected select gate transistors. The selected select gate (SG) transistors are in a selected sub-block (a sub-block selected for programming), and the unselected SG transistors are in unselected sub-blocks (sub-block which are not selected for programming). Subsequently, a plot 1422 with Vsg_sel=2.5 V represents the voltage of the selected SG transistors, and a plot 1423 with Vsg_unsel=0 V represents the voltage of the unselected SG transistors. A plot 1424 represents Vsg_sel=6 V in the verify phase.

FIG. 14D depicts voltages applied to bit lines. The voltage signal 1430 is represented by a plot 1431, depicting a voltage Vbl=2 V, during the pre-charge for selected and unselected bit lines. The selected and unselected bit lines are connected to selected and unselected NAND strings, respectively, in a selected sub-block, in one approach. Subsequently, a plot 1432 depicts Vbl_unsel=2 V (a voltage on unselected bit lines), and a plot 1433 depicts Vbl_sel=0 V (a voltage on selected bit lines). A plot 1434 depicts Vbl_norm, a plot 1435 depicts Vbl_el_min, and a plot 1436 depicts Vbl_el_max. The intermediate elevated voltages between Vbl_el_min and Vbl_el_max are not depicted, for simplicity. In the verify phase, the voltage on the unselected bit lines can be 2 V (plot 1432) and the voltage on the selected bit lines can be Vbl_norm (plot 1434) or one of the elevated bit line voltages (plots 1435 and 1436).

In the pre-charge phase, a positive Vbl (plot 1431) is provided to the drain-side of the channels of the strings to remove residue electrons and to provide a small amount of boosting such as 1-2 V. The SGD transistors of the selected and unselected sub-blocks are in a conductive state at this time, with a voltage of 6 V, for example. This allows the bit line voltage to be passed to the drain end channel. It is also possible for the SGS transistors of the selected and unselected sub-blocks to be in a conductive state at this time, with a voltage of 6 V, for example (plot 1431) to allow the source line voltage (Vsl) to be passed to the source end of the channel.

In the program phase, VWLn and Vwl_unsel are ramped up, e.g., starting at t2, to provide a capacitive coupling up of the channels of the unselected NAND strings. VWLn is then ramped up further at t4-t5 to the peak program pulse level of Vpgm and held at Vpgm until t7. After the program pulse, VWLn is ramped down to Vss (0 V). Subsequently, in the verify phase, one or more verify tests are performed by applying one or more control gate read voltages (plot 1404) on WLn and, for each read voltage, sensing the conductive state of the memory cells in the selected NAND strings of the selected sub-block. In this example, when VvA is applied to WLn from t8-t9, the verify tests are performed for the A and B state memory cells concurrently, and when VvC is applied to WLn from t9-t10, the verify tests are performed for the C and D state memory cells concurrently. This could occur in PL=4-8 in the examples of FIGS. 10B and 11A-11C, for example.

During the program and verify phases, Vsg_sel can be set to, e.g., 2.5 V, for the selected sub-block (plot 1422) and Vsg_unsel can be set to, e.g., 0 V, for the unselected sub-blocks (plot 1433). During the program pulse, with Vbl=0 V (plot 1433), Vsg_sel is high enough to provide the SG_sel transistors in a conductive state for the selected NAND strings. However, it is low enough that the SG_sel transistors can be provided in a non-conductive state for the unselected NAND strings, by setting a high Vbl for those strings. During the program and verify phases, Vbl_unsel can remain high at 2 V for the unselected NAND strings (plot 1432). Vbl_sel can be increased during the verify phase (t8-t10) as part of a sensing process in which the bit lines are charged up.

During the verify phase, the SGD transistor is in a strongly conductive state to allow sensing to occur for the selected memory cell. Thus, the drain-end select gate transistor is in a conductive state during the pre-charge phase and the program phase, for the selected NAND strings. Vsg_unsel is decreased to a reduced level such as 0 V which provides the SG_unsel transistors in a non-conductive state for the strings in the unselected sub-blocks. After the verify phase, at t10, Vbl is decreased to 0 V so that the SGD transistors are cutoff and the channel region has a floating voltage.

FIG. 15A-15D depicts examples of voltage signals which can be used in a read operation, consistent with FIG. 13. The vertical dimension denotes voltage and the horizontal dimension denotes time, with time points t0-t12. The period of time depicted corresponds to a read operation for three pages of data. In particular, a lower page of data is read in the time period 1590 from t1-t3 using the read voltages VrA and VrE, a middle page of data is read in the time period 1591 from t5-t8 using the read voltages VrB, VrD and VrF, and an upper page of data is read in the time period 1592 from t10-t12 using the read voltages VrC and VrG.

A voltage signal 1500 represents VWLn, the voltage of the selected word line, a voltage signal 1510 represents Vwl_unsel, a voltage of unselected word lines, a voltage signal 1520 represents the select gate voltages, e.g., Vsgd and/or Vsgs, and a voltage signal 1530 represents Vbl, a bit line voltage.

Figure 15A:
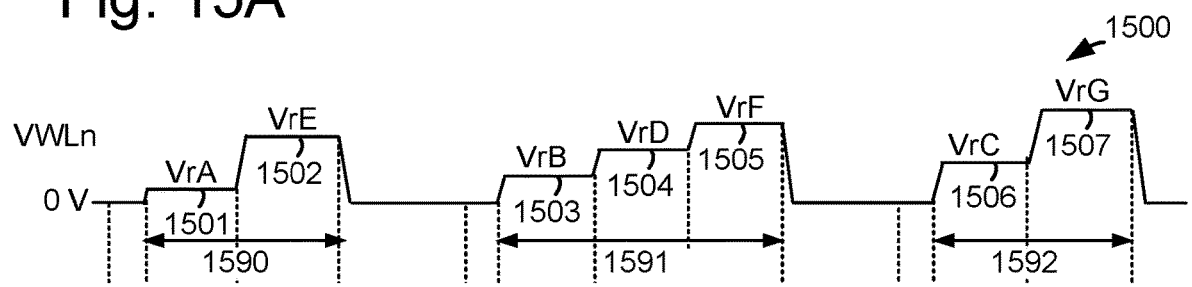
FIG. 15A-15D depicts examples of voltage signals which can be used in a read operation, consistent with FIG. 13.

FIG. 15A depicts voltages applied to a selected word line, WLn. The voltage signal 1500 has an initial voltage of 0 V, is increased to VrA (plot 1501) and then to VrE (plot 1502) for the lower page read, and is then returned to 0 V. The voltage signal is then increased to VrB (plot 1503) and then VrD (plot 1504) and VrF (plot 1505) for the middle page read, and is then returned to 0 V. The voltage signal is then increased to VrC (plot 1506) and then VrG (plot 1507) for the upper page read, and is then returned to 0 V. Sensing occurs during the application of each control gate read voltage for the memory cells connected to WLn in a selected sub-block. Reading can occur one sub-block at a time.

Figure 15B:
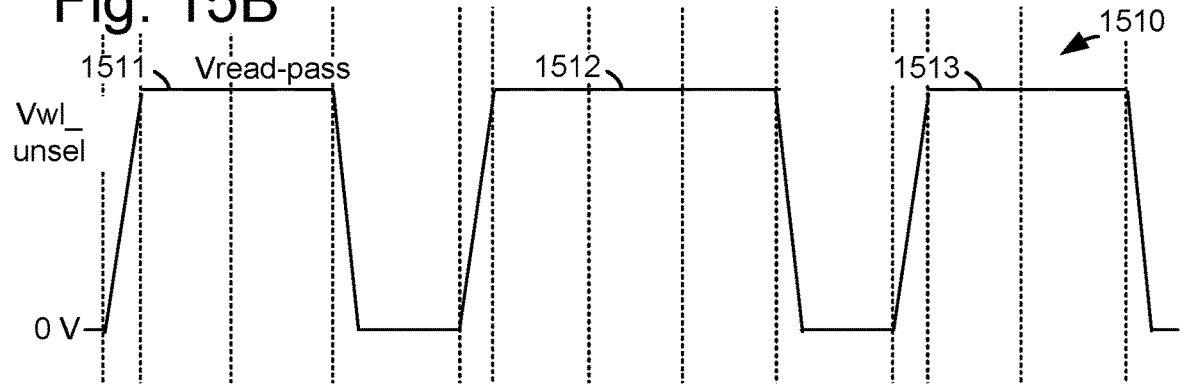

FIG. 15B depicts voltages applied to unselected word lines. During the application of the WLn voltages for the first, second and third page reads of FIG. 15A, plots 1511, 1512 and 1513, respectively, indicate that a read pass voltage, Vread pass, is applied to the unselected word line.

Figure 15C:
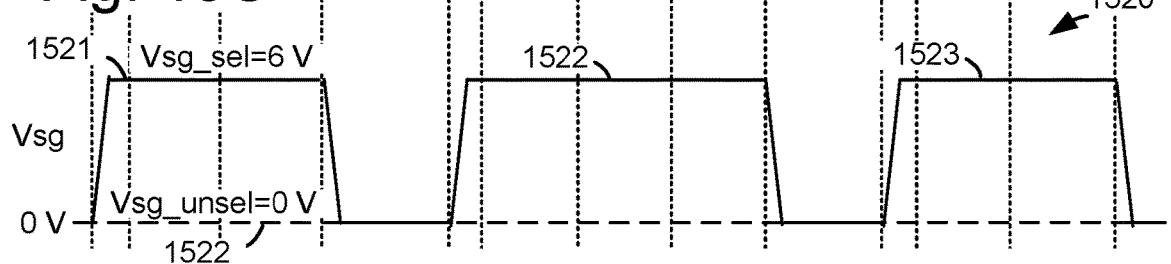

FIG. 15C depicts voltages applied to select gate transistors. The voltage signal 1520 is represented by plots 1521, 1523 and 1524 during the lower, middle and upper page reads, respectively, for the selected sub-block in which the read operation occurs. The selected select gate (SG) transistors are provided in a conductive state to allow sensing to occur. The voltage signal 1522 is provided for the select gate transistors of the unselected sub-blocks. These select gate transistors are provided in a non-conductive state to avoid interfering with the sensing in the selected sub-block.

Figure 15D:
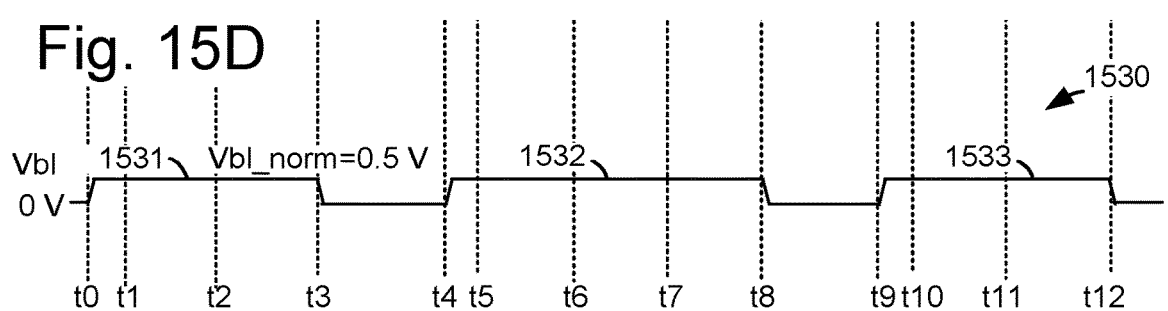

FIG. 15D depicts voltages applied to bit lines. The voltage signal 1530 is represented by plots 1531, 1532 and 1533 depicting a voltage Vbl=Vbl_norm=0.5 V, for the selected and unselected bit lines during the reading of the lower, middle and upper pages, respectively. This Vbl allows sensing to occur, as discussed in connection with FIG. 2, for the selected sub-block. The same Vbl can be used for reading all of the memory cells including those which are assigned to the lower and upper states of an adjacent pair of data states. A plot 1534 depicts a voltage of 0 V which does not allow sensing to occur. In some cases, all of the memory cells are read so that the plot 1532 is not used. As mentioned, the same Vbl_norm can be used for reading of the data states.

In one implementation, an apparatus comprises: a set of memory cells connected to a word line and comprising a first memory cell in a first NAND string; a control circuit configured to apply a program pulse followed by a verify voltage to the first memory cell in respective program loops in a program operation; and a first sense circuit connected to the first NAND string via a first bit line, wherein the first sense circuit, to perform a verify test for the first memory cell during the applying of the verify voltage in the respective program loops, is configured to set a voltage on the first bit line which increases over the respective program loops, and, to read the first memory cell in a read operation after the program operation, is configured to set a voltage on the first bit line which is less than the voltages set on the first bit line during the applying of the verify voltages.

In another implementation, a method comprises: apply a program pulse followed by a verify voltage to a first memory cell in respective program loops in a program operation, the first memory cell is among a set of memory cells connected to a word line and is in a first NAND string, and the first NAND string is connected to a first bit line; and performing a verify test for the first memory cell during the applying of the verify voltage in the respective program loops, the performing the verify test comprises setting a voltage on the first bit line which increases over the respective program loops, and determining whether the first memory cell is in a conductive or non-conductive state.

In another implementation, an apparatus comprises: a set of memory cells connected to a word line and comprising a first memory cell in a first NAND string and a second memory cell in a second NAND string; a first bit line connected to the first NAND string; a second bit line connected to the second NAND string; and a control circuit configured to program the first memory cell and the second memory cell in a program operation; wherein: the first memory cell is assigned to an upper data state of a pair of adjacent data states and the second memory cell is assigned to a lower data state of a pair of adjacent data states; and in the program operation, the first memory cell is verified using successively higher voltages on the first bit line and the second memory cell is verified using a fixed voltage on the second bit line.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a set of memory cells connected to a word line and comprising a first memory cell in a first NAND string;
a control circuit configured to apply a program pulse followed by a verify voltage to the first memory cell in respective program loops in a program operation, the verify voltage is applied to the first memory cell via the word line; and
a first sense circuit connected to the first NAND string via a first bit line, wherein the first sense circuit:
to perform a verify test for the first memory cell during the applying of the verify voltage to the word line in the respective program loops, is configured to set voltages on the first bit line which increase over the respective program loops, the voltages on the first bit line comprise a minimum voltage while sensing the first memory cell during a verify test in a first program loop of the respective program loops, and a higher voltage while sensing the first memory cell during a verify test in a next program loop of the respective program loops, the higher voltage is greater than the minimum voltage, and the next program loop is after the first program loop; and
to read the first memory cell in a read operation after the program operation, is configured to set a voltage on the first bit line which is less than the voltages set on the first bit line during the applying of the verify voltages.

2. The apparatus of claim 1, wherein:
the voltages on the first bit line increase in progressively larger steps over the respective program loops.

3. The apparatus of claim 1, wherein:
the voltages on the first bit line increase in successive program loops of the respective program loops.

4. The apparatus of claim 1, wherein:
the set of memory cells comprises a second memory cell in a second NAND string;
a second sense circuit is connected to the second NAND string via a second bit line; and
the second sense circuit, to perform a verify test for the second memory cell during the applying of the verify voltage in the respective program loops, is configured to set a voltage on the second bit line while sensing the second memory cell during a verify test in the first program loop, the voltage on the second bit line is less than the minimum voltage.

5. The apparatus of claim 4, wherein:
the voltage on the second bit line is fixed during the applying of the verify voltage in the respective program loops.

6. The apparatus of claim 4, wherein:
the second sense circuit, to read the second memory cell in the read operation, is configured to set a voltage on the second bit line equal to the voltage set on the second bit line during the applying of the verify voltages.

7. The apparatus of claim 4, wherein:
the first memory cell is assigned to an upper data state of a pair of data states; and the second memory cell is assigned to a lower data state of the pair of data states.

8. The apparatus of claim 1, wherein:
the voltages on the first bit line during the verify test for the first memory cell increase from the minimum voltage to a maximum voltage over the respective program loops; and
the first sense circuit is configured to set a relatively large difference between the minimum voltage and the maximum voltage when a number of program-erase cycles of the set of memory cells in relatively high.

9. The apparatus of claim 1, wherein:
the voltages on the first bit line during the verify test for the first memory cell increase from the minimum voltage to a maximum voltage over the respective program loops; and
the first sense circuit is configured to set a relatively large difference between the minimum voltage and the maximum voltage when a temperature is relatively low.

10. The apparatus of claim 1, wherein:
the voltages on the first bit line during the verify test for the first memory cell increase from the minimum voltage to a maximum voltage over the respective program loops; and
the first sense circuit is configured to set a relatively large difference between the minimum voltage and the maximum voltage when an assigned data state of the first memory cell is relatively high.

11. A method, comprising:
apply a program pulse followed by a verify voltage to a first memory cell in respective program loops in a program operation, the first memory cell is among a set of memory cells connected to a word line and is in a first NAND string, and the first NAND string is connected to a first bit line; and
performing a verify test for the first memory cell during the applying of the verify voltage in the respective program loops, the performing the verify test comprises setting a first voltage on the first bit line while sensing the first memory cell in a first program loop of the respective program loops, and setting a second voltage on the first bit line while sensing the first memory cell in a second program loop of the respective program loops, the second voltage is greater than the first voltage and the second program loop is after the first program loop.

12. The method of claim 11, further comprising:
reading the first memory cell in a read operation after the program operation, the reading comprises setting a voltage on the first bit line which is less than the first voltage and the second voltage.

13. The method of claim 11, wherein the set of memory cells comprises a second memory cell in a second NAND string, and the second NAND string is connected to a second bit line, the method further comprising:
performing a verify test for the second memory cell during the applying of the verify voltage in the respective program loops, the performing the verify test for the second memory cell comprises setting a fixed voltage on the second bit line in the first program loop and in the second program loop while determining whether the second memory cell is in a conductive or non-conductive state.

14. The method of claim 13, wherein:
the fixed voltage on the second bit line is less than the first voltage and the second voltage.

15. An apparatus, comprising:
a set of memory cells connected to a word line and comprising a first memory cell in a first NAND string and a second memory cell in a second NAND string;
a first bit line connected to the first NAND string;
a second bit line connected to the second NAND string; and
a control circuit configured to program the first memory cell and the second memory cell in a program operation; wherein:
the program operation comprises a plurality of program loops, each program loop having a program loop number;
the first memory cell is assigned to an upper data state of a pair of adjacent data states and the second memory cell is assigned to a lower data state of the pair of adjacent data states; and
in the program operation, the first memory cell is verified using successively higher voltages on the first bit line which increase as a function of the program loop number while the second memory cell is verified using a fixed voltage on the second bit line.

16. The apparatus of claim 15, wherein:
the first memory cell is verified using the successively higher voltages on the first bit line in successive program loops of the program operation and the second memory cell is verified using the fixed voltage on the second bit line in the successive program loops of the program operation.

17. The apparatus of claim 15, wherein:
the successively higher voltages on the first bit line increase in progressively larger steps in successive program loops of the program operation.

18. The apparatus of claim 15, wherein:
the control circuit is configured to read the first memory cell and the second memory cell in a read operation after the program operation; and
a voltage applied to the first bit line during a read of the first memory cell is equal to a voltage applied to the second bit line during a read of the second memory cell.

19. The apparatus of claim 15, wherein:
the successively higher voltages on the first bit line comprise a minimum level and a maximum level; and
a difference between the minimum level and the maximum level is a function of the upper data state.

20. The apparatus of claim 4, wherein:
in each of the respective program loops, the sensing of the first memory cell is concurrent with the sensing of the second memory cell.

* * * * *